US008659213B2

(12) United States Patent
Mizusawa et al.

(10) Patent No.: US 8,659,213 B2
(45) Date of Patent: Feb. 25, 2014

(54) PIEZOELECTRIC DEVICES AND METHODS FOR MANUFACTURING THE SAME

(75) Inventors: Shuichi Mizusawa, Saitama (JP); Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 186 days.

(21) Appl. No.: 13/272,890

(22) Filed: Oct. 13, 2011

(65) Prior Publication Data
US 2012/0139391 A1    Jun. 7, 2012

(30) Foreign Application Priority Data

Oct. 15, 2010  (JP) .................................. 2010-232454
Dec. 16, 2010  (JP) .................................. 2010-280069
Apr. 11, 2011  (JP) .................................. 2011-086933

(51) Int. Cl.
*H01L 41/047* (2006.01)
*H01L 41/053* (2006.01)
*H03H 9/21* (2006.01)

(52) U.S. Cl.
USPC ........................... 310/348; 370/365; 370/370

(58) Field of Classification Search
USPC ......... 310/340, 344, 348, 366, 364, 365, 370, 310/367, 360, 363
IPC ...................... H01L 41/053,41/047; H03H 9/21
See application file for complete search history.

(56) References Cited

U.S. PATENT DOCUMENTS

| 8,519,601 B2* | 8/2013 | Shimao et al. ............... 310/344 |
| 8,531,092 B2* | 9/2013 | Ichikawa et al. ............ 310/364 |
| 2013/0207523 A1* | 8/2013 | Ichikawa ..................... 310/348 |
| 2013/0241358 A1* | 9/2013 | Mizusawa et al. ........... 310/348 |
| 2013/0264910 A1* | 10/2013 | Takahashi .................... 310/348 |

FOREIGN PATENT DOCUMENTS

JP    2006-148758    6/2006

* cited by examiner

*Primary Examiner* — Shawki Ismail
*Assistant Examiner* — Karen B Addison
(74) *Attorney, Agent, or Firm* — Klarquist Sparkman, LLP

(57) ABSTRACT

Piezoelectric vibrating devices have piezoelectric vibrating pieces of which the vibration frequency is measurable individually on a wafer scale, without being affected by adjacent piezoelectric devices on the wafer. An exemplary piezoelectric device includes a piezoelectric vibrating piece having excitation electrodes and respective extraction electrodes. The device includes a package base with two connecting electrodes facing the vibrating piece and connected to respective extraction electrodes. Two pairs of mounting terminals are situated on the outer surface of the package base. Also on the outer surface of the package base are two pairs of opposing castellations that are recessed toward the center of the package base. Edge-surface electrodes connect the first and second main surfaces of the base; one pair is connected to the connecting electrodes and the other pair is connected to respective mounting terminals.

8 Claims, 25 Drawing Sheets

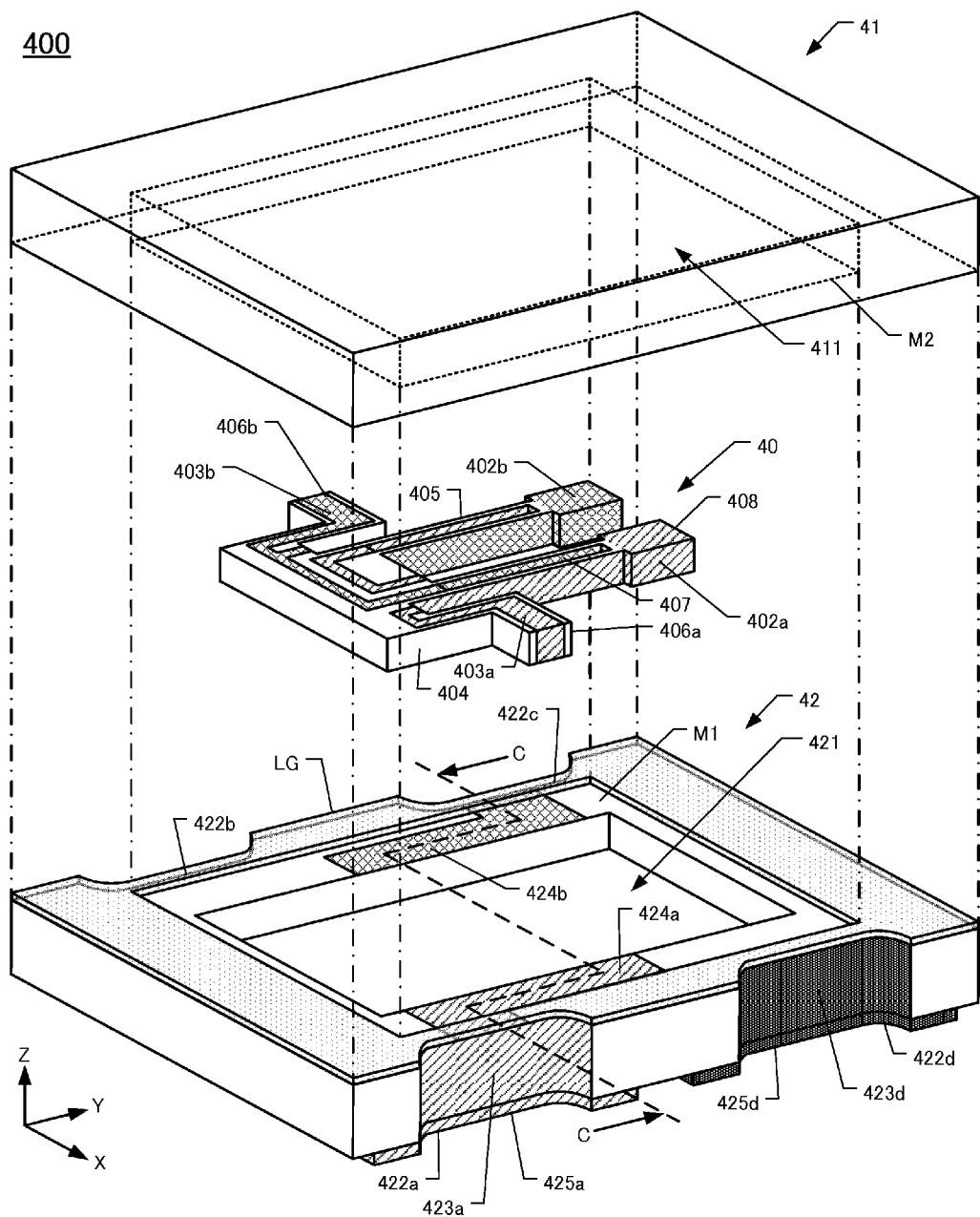

PIEZOELECTRIC DEVICES AND METHODS FOR MANUFACTURING THE SAME

FIELD

This disclosure pertains to piezoelectric devices in which a plurality of package lids and package bases are manufactured at a wafer scale. This disclosure also pertains to methods for manufacturing such devices.

DESCRIPTION OF THE RELATED ART

Surface-mountable piezoelectric devices are preferably manufactured by wafer unit. In the piezoelectric device disclosed in Japan Unexamined Patent Document No. 2006-148758, a quartz-crystal wafer having a plurality of quartz-crystal vibrating pieces is sandwiched between a lid wafer and a base wafer, wherein all three wafers have the same shape. Also, in the methods for manufacturing piezoelectric devices as disclosed in the Japan Unexamined Patent Document No. 2006-148758, an opening is made on the lid wafer and the base wafer on each device, and an edge wire is formed on each device for electrically connecting the respective excitation electrodes with respective external terminals on each corner of the piezoelectric device. Then, the piezoelectric devices manufactured on the wafer are separated into individual pieces.

PRIOR ART

Patent Document

[Patent Document 1] Japan Unexamined Patent Document No. 2006-148758

Problems to be Solved by the Invention

However, since the edge wire is formed on opening of the lid wafer and base wafer simultaneously in the manufacturing method of Japan Unexamined Patent Publication No. 2006-148758, the adjacent piezoelectric devices on the wafers are connected to adjacent piezoelectric devices by the edge wire. Thus, whenever a probe for measuring vibration frequency is contacted onto one piezoelectric vibrating piece on the wafer, the probe affects the performance of adjacent piezoelectric vibrating pieces. Therefore, according to the piezoelectric device and the manufacturing method disclosed in Japan Unexamined Patent Publication No. 2006-148758, vibration frequency produced by individual piezoelectric vibrating piece on the wafer cannot be measured. This situation prevents the frequency of individual piezoelectric vibrating pieces on the wafer from being measured until after the piezoelectric vibrating pieces have been separated into individual pieces.

From the perspective of mass production, whenever multiple piezoelectric devices are simultaneously manufactured on a wafer scale, it is preferred to measure the vibration frequency of the piezoelectric vibrating pieces while still on the wafer, and to separate piezoelectric devices after adjusting the vibration frequency at a wafer scale.

In view of the foregoing, the present disclosure provides, inter alia, piezoelectric devices in which the respective vibration frequencies of a plurality of piezoelectric devices on the wafer can be measured without being affected by adjacent piezoelectric devices. The present disclosure also provides methods for manufacturing such piezoelectric devices.

SUMMARY OF THE INVENTION

A first aspect is directed to a piezoelectric device. In its first aspect, a piezoelectric device comprises: a piezoelectric vibrating piece including a pair of excitation electrodes formed on both principal surfaces and a pair of extraction electrodes extracted from the pair of excitation electrodes; and a package base including a pair of connecting electrodes formed on the first surface facing toward the piezoelectric vibrating piece and connected to the pair of extraction electrodes and two pairs of mounting terminals situated on the second surface opposing the first surface, the package base having a rectangular profile when viewed from the first surface. On two edges of the package base opposing each other, two pairs of castellations are formed opposing each other and recessed toward a center of the package base, and two pairs of edge surface electrodes are formed for connecting the first surface and the second surface. Out of two pairs of edge surface electrodes, one pair is connected to the pair of connecting electrodes and one pair is connected to one pair out of two pairs of mounting terminals.

A second aspect is directed to a piezoelectric device. In its second aspect, the piezoelectric device comprises two pairs of mounting terminals including a pair of external electrodes for electrically connecting to outside and a pair of grounding electrodes for grounding; and the pair of external electrodes and the pair of grounding electrodes are formed diagonally from each other along the second surface.

A third aspect is directed to a piezoelectric device. In its third aspect, the piezoelectric device comprises two pairs of mounting terminals including a pair of external electrodes for electrically connecting to outside and a pair of grounding electrodes for grounding; and the pair of external electrodes is situated on one edge and the pair of grounding electrodes is situated on an opposing edge.

A fourth aspect is directed to a piezoelectric device. In its fourth aspect of the piezoelectric device, the package base comprises a recess portion recessed from the first surface; and the piezoelectric vibrating piece is mounted onto the package base using an electrically conductive adhesive, so as to connect the pair of extraction electrodes and the pair of connecting electrodes.

A fifth aspect is directed to a piezoelectric device. In its fifth aspect, the piezoelectric device comprises a rectangular package lid that is bonded to the first surface of the package base; wherein the package lid and the package base are bonded together using a sealing material.

A sixth aspect is directed to a piezoelectric device. In its sixth aspect, the piezoelectric vibrating piece comprises a vibrating portion having the pair of excitation electrodes and a rectangular outer frame surrounding the vibrating portion; and the piezoelectric vibrating piece is disposed so as to align the pair of extraction electrodes and the pair of connecting electrodes.

A seventh aspect is directed to a piezoelectric device. In its seventh aspect, the piezoelectric device comprises a package lid bonded to a first principal surface of the outer frame; wherein the package lid and the first principal surface of the outer frame are bonded using the sealing material, and the second principal surface of the outer frame and the package base are bonded using the sealing material.

An eighth aspect is directed to a piezoelectric device. In its eighth aspect, a protruding portion is formed in a center of each castellation formed between the first surface and the second surface and along a cross-section of the castellation, the protruding portion tapers outward.

A ninth aspect is directed to a manufacturing method of a piezoelectric device having two pairs of mounting terminals. In its ninth aspect, the manufacturing method of the piezoelectric device includes the steps of preparing a piezoelectric vibrating piece having a pair of excitation electrodes and a pair of extraction electrodes formed on each principal surface; preparing a base wafer comprising a first base portion having a rectangular first base portion and a second base portion, each base portion having a first surface and a second surface opposing the first surface, and a pair of through-holes is formed on an edge connecting the first base portion and the second base portion that extends depthwise from the first surface to the second surface; forming electrodes on a pair of edge surface electrodes on an edge surface of the pair of through-holes on the base wafer, and forming the mounting terminal surrounding the first package base of the pair of through-holes and the second package base of the pair of through-holes; mounting the piezoelectric vibrating piece onto the first base portion and the second base portion, so as to connect the pair of extraction electrode of the piezoelectric vibrating piece to the mounting terminal of the first base portion and to the mounting terminal of the second base portion; and first measuring step of measuring a vibration frequency of the piezoelectric vibrating piece mounted onto the first package base and the second package base via the mounting terminal. Two pairs of mounting terminals include a pair of extraction electrodes and a pair of grounding electrodes for grounding, in which are electrically connected to external environment, in the electrode forming step, the external electrode of the first base portion and the grounding electrode of the second base portion is formed on a first edge of the pair of edge surface electrode, and the grounding electrode of the first base portion and the external electrode of the second base portion is formed on a second edge opposing the first edge of the pair of edge surface electrode.

A tenth aspect is directed to a manufacturing method of a piezoelectric device having two pairs of mounting terminals. In its tenth aspect, the manufacturing method of the piezoelectric device includes the steps of: preparing a piezoelectric wafer including a vibrating piece having a pair of excitation electrodes formed on each principal surface and a pair of extraction electrodes extracted from the pair of excitation electrodes, wherein a first piezoelectric vibrating piece and a second piezoelectric vibrating piece including a frame body surrounding the vibrating piece is formed adjacent to each other; preparing a base wafer including a first base portion and a second base portion, shaped in a rectangular shape and having a first surface and a second surface opposing the first surface, and a pair of through-holes is formed extending depthwise through the first surface to the second surface, on an edge between two adjacent base portions; forming a pair of edge surface electrodes on an edge surface of the pair of through-holes on a base wafer, and forming the mounting terminals on the first base portion and the mounting terminals on the second base portion around the pair of through-holes on the second surface; mounting the piezoelectric wafer onto the base wafer, so that the first piezoelectric vibrating piece and the second piezoelectric vibrating piece correspond to the respective first base portion and the second base portion; and first measuring step of measuring a vibration frequency of the first piezoelectric vibrating piece and the second piezoelectric vibrating piece through the mounting terminals. Two pairs of mounting terminals include a pair of external electrodes which is electrically connected to external environment, and a pair of grounding electrodes for grounding; and in the electrode forming step, the external electrode of the first base portion and the grounding electrode of the second base portion is formed on a first edge of the pair of edge surface electrode, and the grounding electrode of the first base portion and the external electrode of the second base portion is formed on a second edge opposing the first edge of the pair of edge surface electrode.

An eleventh aspect is directed to a manufacturing method of a piezoelectric device. In its eleventh aspect, the manufacturing method of the piezoelectric device further includes the steps of first adjusting step of adjusting the vibration frequency of the piezoelectric vibrating piece after the first measuring step; preparation step of preparing a lid wafer; and cutting step of, after sealing the base wafer with the lid wafer, cutting the base wafer and dividing a through-hole for forming a pair of through-holes.

A twelfth aspect is directed to a manufacturing method of a piezoelectric device. In its twelfth aspect of manufacturing a piezoelectric device, while forming the through-holes in the base wafer preparation step, the first surface and the second surface is etched or sand-blasted, and; sputtering is applied from the first surface and the second surface, while forming the edge surface electrode onto the through-holes in the electrode forming step.

A thirteenth aspect is directed to a manufacturing method of a piezoelectric device. The thirteenth aspect of manufacturing a piezoelectric device includes: the second measuring step of measuring the vibration frequency of the first piezoelectric vibrating piece and the second piezoelectric vibrating piece of the piezoelectric wafer, after the piezoelectric preparation step and before the mounting step, through the pair of extraction electrodes; and second adjusting step of, after the second measuring step, adjusting the vibration frequency of the first piezoelectric vibrating piece and the second piezoelectric vibrating piece.

Advantageous Effect of the Invention

According to the present disclosure, the piezoelectric device is provided in which the vibration frequency of each piezoelectric vibrating piece can be measured at a wafer scale without being affected by adjacent piezoelectric devices. The present disclosure also provides the manufacturing method thereof.

BRIEF DESCRIPTION OF THE DRAWINGS

In FIG. 20A, the package lid 31 is omitted from the drawing.

FIG. 21 is an exploded perspective view of the fourth quartz-crystal vibrating device 400 in the fourth embodiment.

DETAILED DESCRIPTION

In the first, second, and third embodiments described below, an AT-cut quartz-crystal vibrating piece is used as the piezoelectric vibrating piece. An AT-cut quartz-crystal vibrating piece has a principal surface (in the YZ plane) that is tilted by 35° 15' about the Y-axis of the crystal coordinate system (XYZ), in the direction of the Y-axis, from the Z-axis around the X-axis. Thus, in the first embodiment, new axes tilted with respect to the axial directions of the quartz-crystal vibrating piece are denoted as the Y'-axis and Z'-axis, respectively. Therefore, in the first to third embodiments, the longitudinal direction of the quartz-crystal vibrating device is referred as the X-axis direction, the height direction of the vibrating device is referred as the Y'-axis direction, and the direction normal to the X-axis and Y'-axis directions is referred as the Z'-axis direction, respectively.

First Embodiment

<Overall Configuration of the First Quartz-Crystal Vibrating Device 100>

Figure 1:
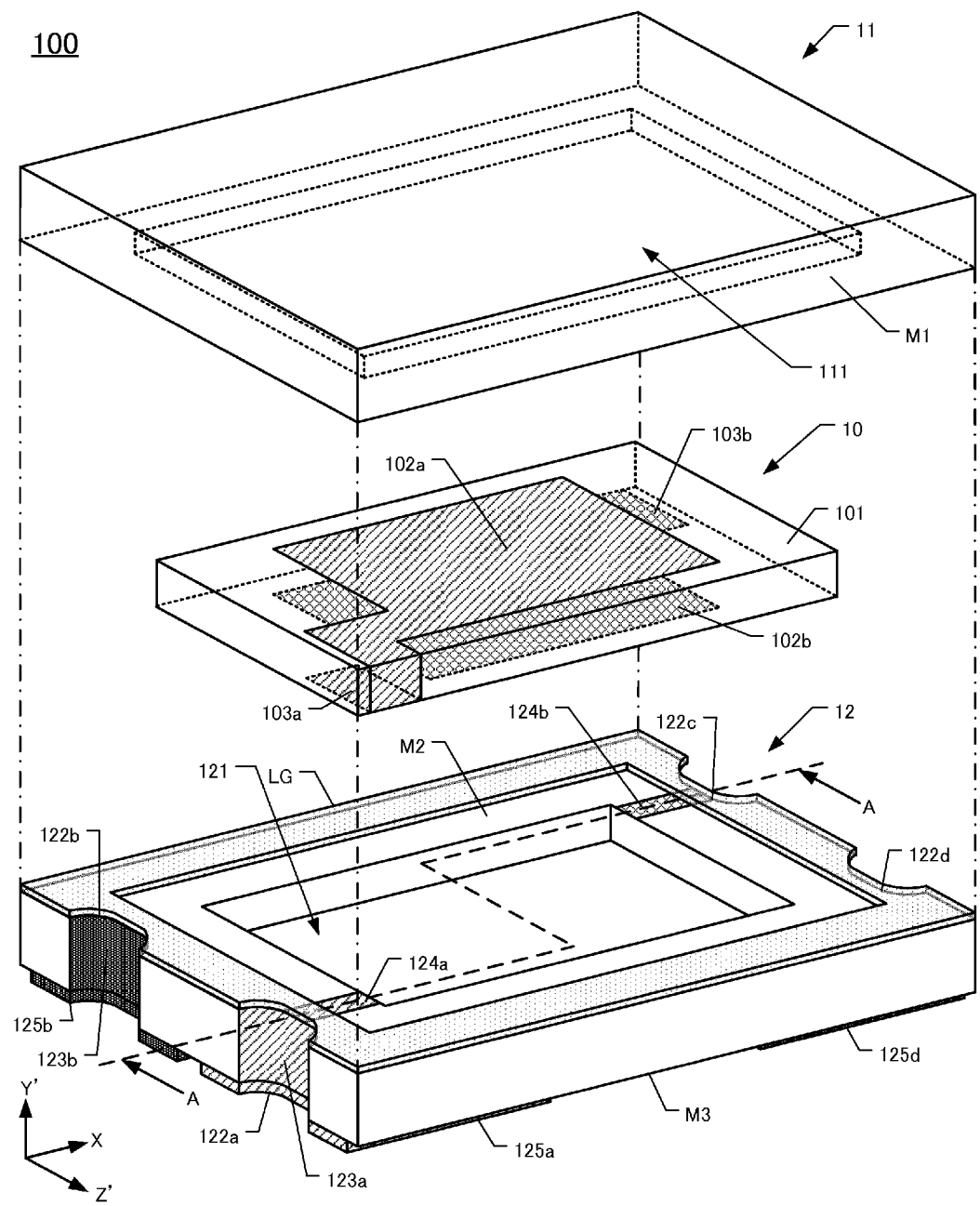
FIG. 1 is an exploded perspective view of a quartz-crystal vibrating device 100 in the first embodiment.

The general configuration of a first embodiment of a quartz-crystal vibrating device 100 is described below with reference to FIGS. 1 and 2. FIG. 1 is an exploded perspective view of a quartz-crystal vibrating device 100 according to the first embodiment, and FIG. 2 is a cross-sectional view of the first quartz-crystal vibrating device 100 taken along the A-A line in FIG. 1. In FIG. 1, a low-melting-point glass LG used as a sealing material is drawn as being transparent, so that the entire connecting electrodes 124a and 124b can be viewed.

As shown in FIGS. 1 and 2, a first quartz-crystal vibrating device 100 comprises a package lid 11 defining a lid recess 111, a package base 12 defining a base recess 121, and a quartz-crystal vibrating piece 10 mounted on the package base 12.

The quartz-crystal vibrating piece 10 comprises an AT-cut quartz-crystal piece 101, and a pair of respective excitation electrodes 102a and 102b situated substantially in the center of the quartz-crystal piece 101 on the respective principal surfaces thereof. The excitation electrode 102a is connected to a respective extraction electrode 103a, extending in the –X-axis direction of the lower main surface (+Z'-axis side surface) of the quartz-crystal piece 101. The excitation electrode 102b is connected to a respective extraction electrode 103b, extending in the +X-axis direction of the lower main surface (surface on the –Z'-axis side) of the quartz-crystal piece 101. The quartz-crystal vibrating piece 10 can be mesa-type or inverted-mesa-type.

Each excitation electrode 102a, 102b and extraction electrode 103a and 103b comprises a foundation layer of chromium (Cr) with an overlying layer of gold. An exemplary thickness of the chromium layer is in the range of 0.05 μm to 0.1 μm, and an exemplary thickness of the gold layer is in the range of 0.2 μm to 2 μm.

The package base 12 is fabricated from a glass or piezoelectric material, and comprises a second peripheral surface M2 on its first surface (+Y'-side surface), circumscribing a base recess 121. On one edge of the package base 12 in the –X-axis direction are two base castellations 122a, 122b, which was formed simultaneously with formation of the base through-holes BH1 (refer to FIGS. 6 and 7) extend in the Z'-axis direction. The base castellation 122a is situated on the +Z-axis side, and the base castellation 122b is situated on the –Z-axis. Similarly, on the other edge of the package base 12 in the +X-axis direction, two other base castellations 122c and 122d are situated, which was formed simultaneously with formation of the base through-holes BH1 (refer to FIGS. 6 and 7) and extend in the Z'-axis direction. Here, the base castellation 122c extends in the –Z-axis direction, and the base castellation 122d extends in the +Z'-axis direction. Thus, the base castellation 122a opposes the base castellation 122c on the package base 12, and the base castellation 122b opposes the base castellation 122d.

On the base castellations 122a-122d are respective base edge-surface electrodes 123a-123d. The second peripheral surface M2 of the package base 12 includes a pair of connecting electrodes 124a, 124b. A connecting electrode 124a is electrically connected to the base edge-surface electrode 123a; similarly, a connecting electrode 124b is electrically connected to the base edge-surface electrode 123c. The base edge-surface electrodes 123a, 123c oppose each other diagonally across the package base 12.

The package base 12 also comprises two pairs of mounting terminals 125a to 125d, which are electrically connected to respective base edge surface electrodes 123a to 123d. Of two pairs of mounting terminals 125a to 125d, one pair 125a and 125c serves as mounting electrodes (hereinafter referred to as "external electrodes") that is disposed diagonally on the package base 12 and connected to respective connecting electrodes 124a and 124b via respective base edge surface electrodes 123a and 123c. Whenever an alternating voltage (voltage that alternates the positive and negative) is applied across the grounding electrodes 125a, 125c, the quartz-crystal vibrating device 10 exhibits thickness-shear vibration mode.

The other pair of mounting terminals 125b and 125d serves as mounting terminals for grounding electrodes (hereinafter referred as "grounding electrodes") 125b and 125d, used for grounding of the base edge-surface electrodes 123b and 123d, as necessary. Thus, the grounding electrodes 125b and 125d are disposed along different diagonals compared to the external electrodes 125a and 125c. Since the grounding electrodes 125b and 125d are used for grounding, they also include respective terminals for bonding the quartz-crystal vibrating device 100 to the mounting printed board (not drawn) without electrically connections.

Figure 2A:
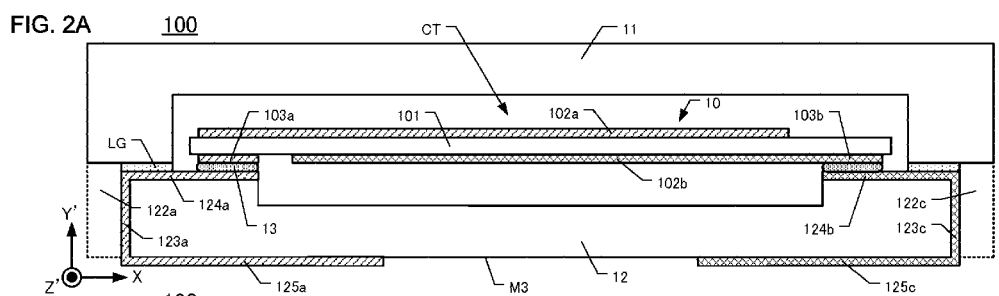
FIG. 2A is a cross-sectional view of the first quartz-crystal vibrating device 100 taken along the A-A line iii FIG. 1.
Figure 2B:
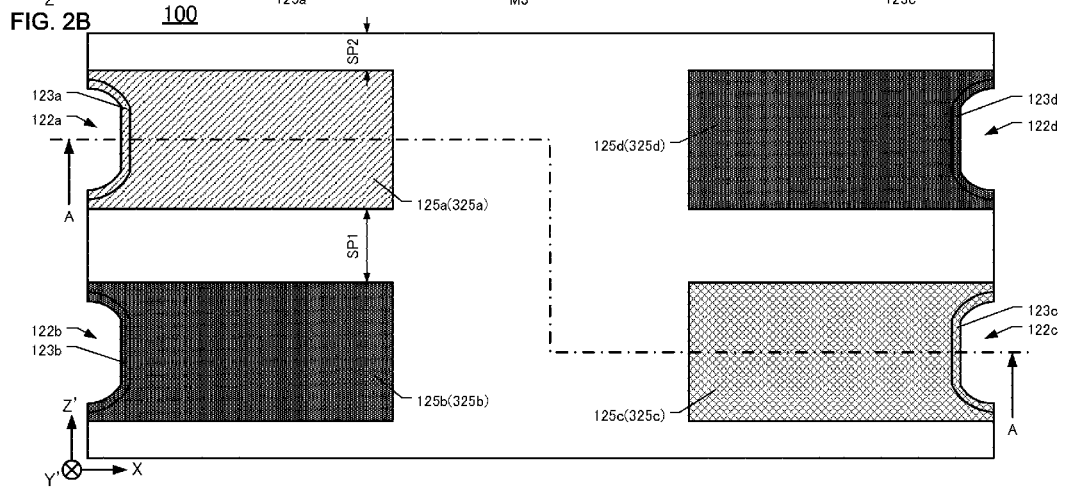
FIG. 2B is a plan view of the lower main surface of the first embodiment of a quartz-crystal vibrating device.

As shown in FIG. 2B, the pair of external electrodes 125a and 125c, and the pair of grounding electrodes 125b and 125d are disposed apart from each other. The external electrode 125a and the grounding electrode 125d are situated apart from one edge in the +Z'-axis direction. The grounding electrode 125b and the external electrode 125c are formed apart from one edge in the −Z'-axis direction. A space SP1 situated between each external electrode 125a and its corresponding grounding electrode 125b and between each external electrode 125c and its corresponding grounding electrode 125d in the Z'-axis direction. The width of the space SP1 is, for example, 200 μm to 500 μm. Also, a space SP2 is situated between each external electrode 125a and the adjacent edge of the package base 12, between each grounding electrode 125d and the adjacent edge of the package base 12, between each grounding electrode 125b and the adjacent edge of the package base 12, between each external electrode 125c and the adjacent edge of the package base 12. The space SP2 is, for example, 0 μm to 100 μm wide in the Y-axis direction.

In the first quartz-crystal vibrating device 100, length of the quartz-crystal vibrating piece 10 in the X-axis direction is longer than the base recess 121. Therefore, whenever a quartz-crystal vibrating piece 10 is mounted onto a package base 12 using electrically conductive adhesive 13, both X-axis direction edges of the quartz-crystal vibrating piece 10 mount to the second peripheral surface M2 of the package base 12, as shown in FIG. 2A. Thus the extraction electrodes 103a and 103b on the quartz-crystal vibrating piece 10 are electrically connected to respective connecting electrodes 124a and 124b on the package base 12. Hence, the respective external electrodes 125a and 125c are connected to respective excitation electrodes 102a and 102b through the respective base edge surface electrodes 123a and 123c, the respective connecting electrodes 124a and 124b, the electrically conductive adhesive 13 and extraction electrodes 103a and 103b.

The package lid 11 comprises a lid recess 111 having greater in the XZ' plane than the base recess 121 in the XZ'-plane. A first peripheral surface M1 circumscribes the lid recess 111. Whenever the first peripheral surface M1 of the package lid 11 and the second peripheral surface M2 of the package base 12 are bonded together, it defines a cavity CT in which the quartz-crystal vibrating piece 10 is situated. The cavity CT is defined in part by the lid recess 111 of the package lid 11 and in part by the base recess 121 of the package base 12. The cavity CT is filled with an inert-gas or is under a vacuum.

The first peripheral surface M1 and second peripheral surface M2 are bonded together using a sealing material (non-electrically conductive adhesive), for example a low-melting-point glass LG. Low-melting-point glass LG is a lead-free vanadium-based glass having an adhesive component that melts at 350° C. to 410° C. Vanadium-based glass can be formulated as a paste mixed with binder and solvent. Vanadium-based glass bonds to various materials by melting and solidification. Low-melting-point glass forms a highly reliable air-tight seal and resists water and humidity. Also, since the coefficient of thermal expansion of low-melting-point glass can be controlled effectively by controlling its glass structure, this material can adjust to various coefficients of thermal expansion.

Regarding the package lid 11, the lid recess 111 is longer in the X-axis direction than the quartz-crystal vibrating piece 10 in the X-axis direction and the base recess 121 in the X-axis direction. Also, as shown in FIGS. 1 and 2A-2B, the low-melting-point glass LG bonds the package lid 11 and the package base 12 at the second peripheral surface M2, having a width of approximately 300 μm.

Although the quartz-crystal vibrating piece 10 of this embodiment is mounted inside the package on the second peripheral surface M2 of the package base 12, the vibrating piece can be stored inside the base recess 121. In such an instance, the connecting electrodes are parts of respective base castellations 122a, 122c and extend to the bottom surface of the base recess 121 via the second peripheral surface M2. Alternatively, the package lid can be planar and lack a recess.

<Method for Manufacturing the First Embodiment of a Quartz-Crystal Vibrating Device>

Figure 3:
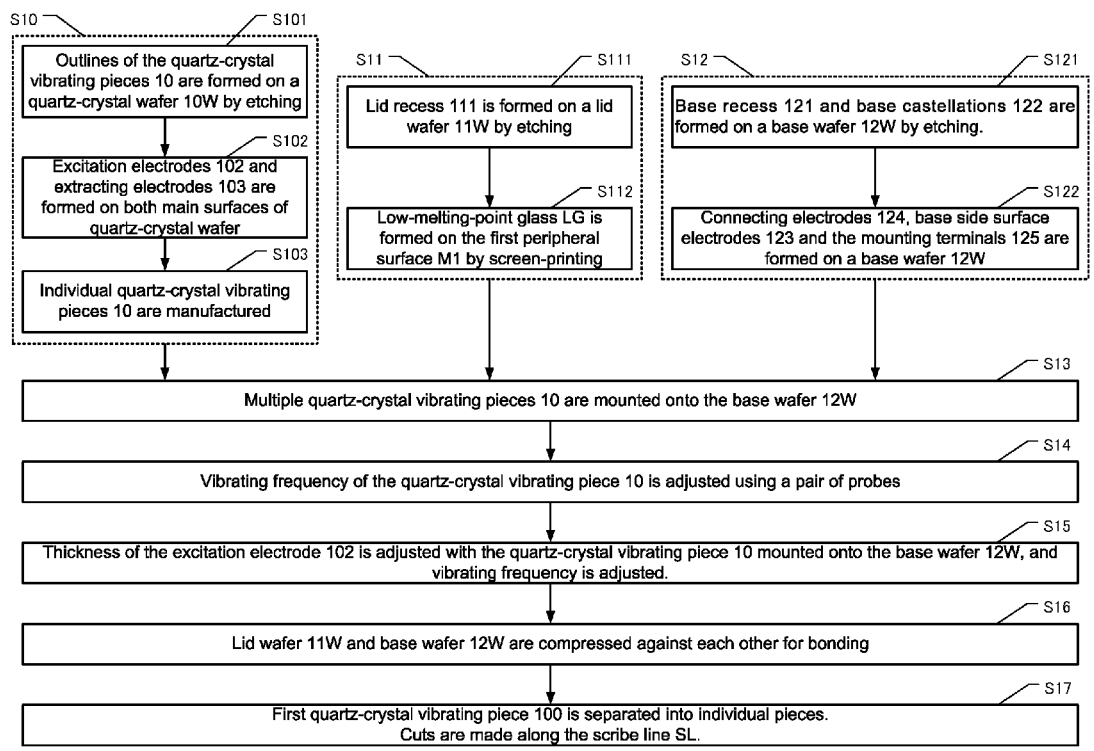
FIG. 3 is a flow-chart showing a method for manufacturing the first quartz-crystal vibrating device 100.
Figure 4:
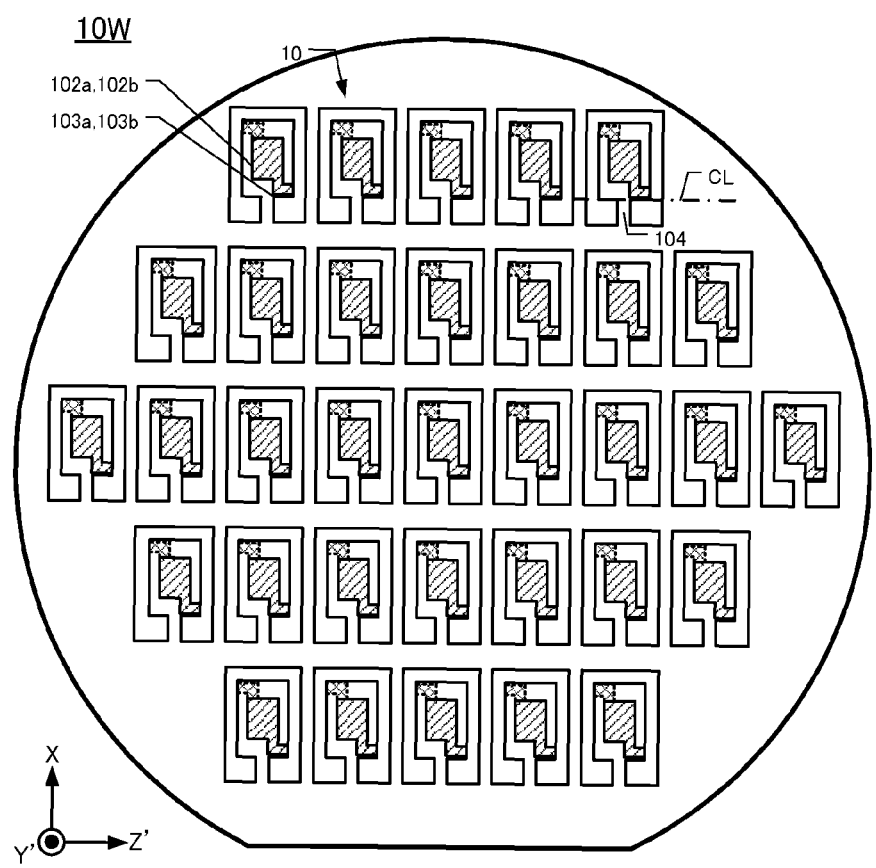
FIG. 4 is a plan view of the quartz-crystal wafer 10W.
Figure 5:
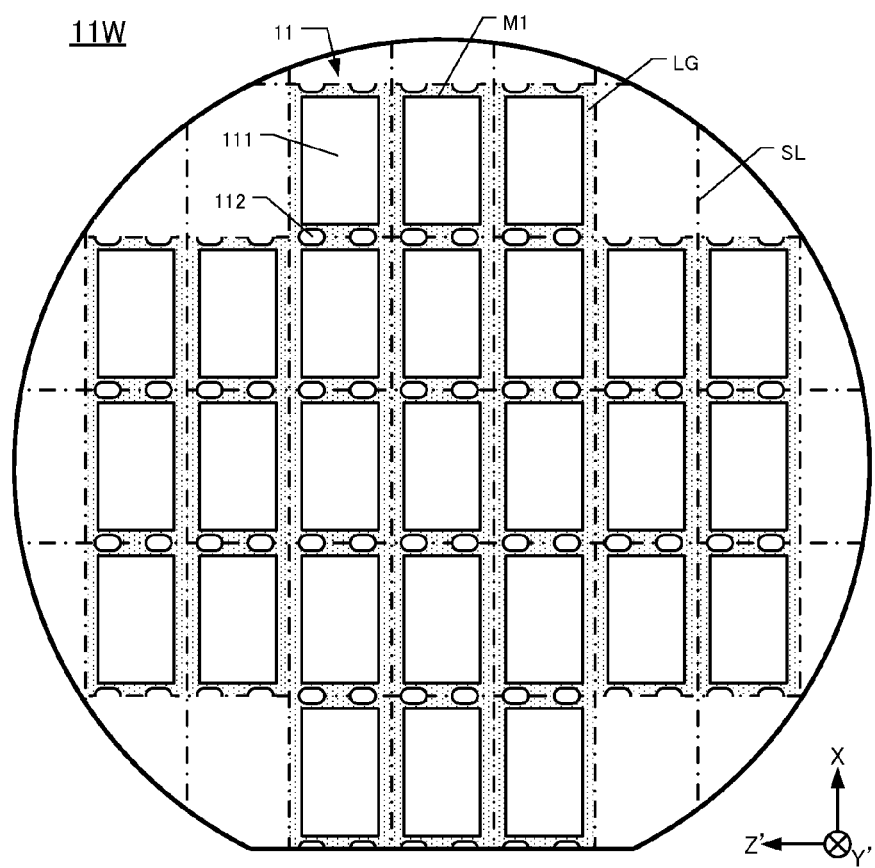
FIG. 5 is a plan view of the lid wafer 11W.
Figure 6:
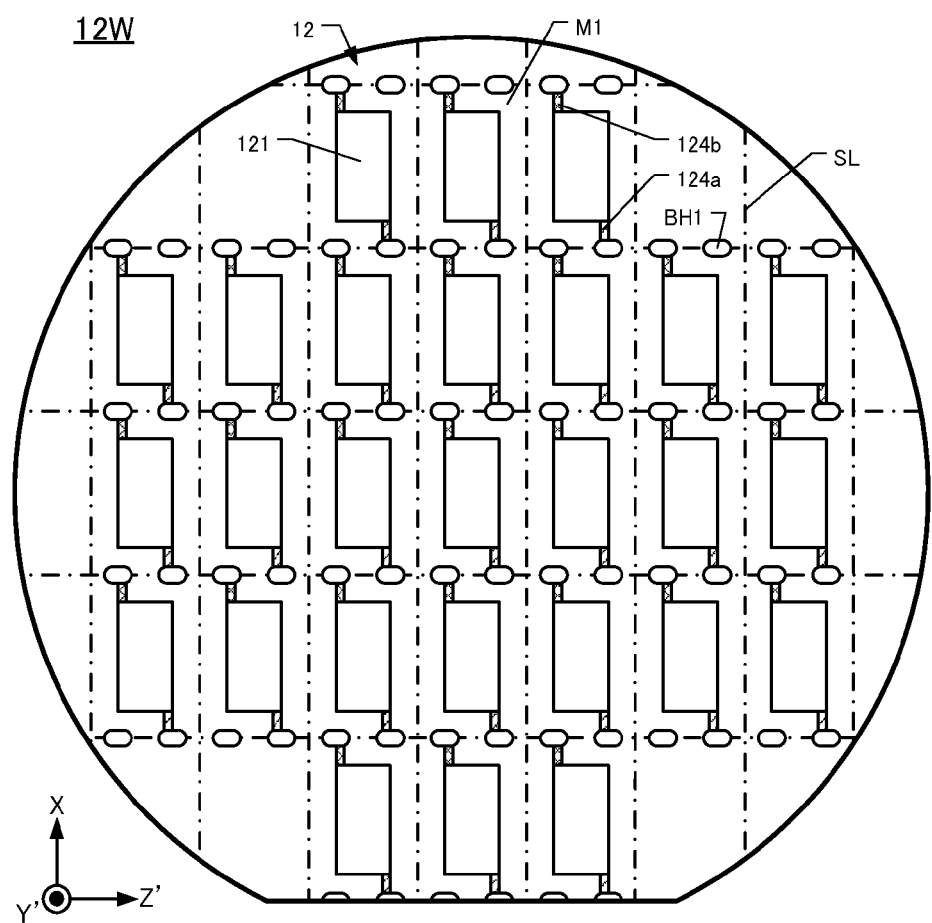
FIG. 6 is a plan view of the base wafer 12W.
Figure 7:
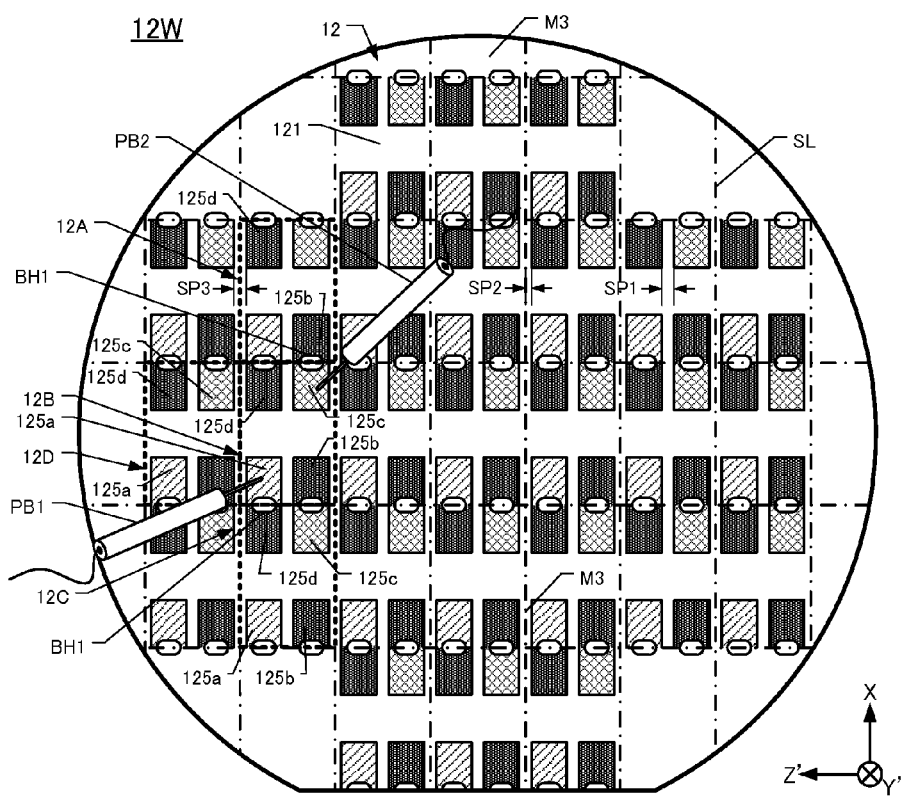
FIG. 7 is a bottom surface view of the base wafer 12W.

FIG. 3 is a flow-chart of an embodiment of a method for manufacturing the first embodiment of a quartz-crystal vibrating device 100. In FIG. 3, a protocol S10 is for manufacturing the quartz-crystal vibrating piece 10, a protocol S11 is for manufacturing the package lid 11, and a protocol S12 is for manufacturing the package base 12. The protocols S10, S11, S12 can be carried out separately or in parallel. FIG. 4 is a plan view of a quartz-crystal wafer 10W in which a plurality of quartz-crystal vibrating pieces 10 can be manufactured simultaneously. FIG. 5 is a plan view of the lid wafer 11W in which a plurality of package lids 11 can be manufactured simultaneously. FIG. 6 is a plan view of a base wafer 12W in which a plurality of package bases 12 can be manufactured simultaneously. FIG. 7 is a plan view of the lower main surface view of the base wafer 12W.

In protocol S10, the quartz-crystal vibrating piece 10 is manufactured. The protocol S10 includes steps S101-S103. In step S101 (see FIG. 4) the profile outlines of multiple quartz-crystal vibrating pieces 10 are formed on the planar surface of the quartz-crystal wafer 10W by etching. Each quartz-crystal vibrating piece 10 is connected to the quartz-crystal wafer 10W by a respective joining portion 104.

In step S102 a layer of chromium is formed, followed by formation of an overlying layer of gold, on both main surfaces as well as the edge surfaces of the entire quartz-crystal wafer 10W by sputtering or vacuum-deposition. Then, a photoresist is applied uniformly on the surface of the metal layer. Using an exposure tool (not shown), the profile outlines of the excitation electrodes and of the extraction electrodes are lithographically exposed onto the crystal wafer 10W. Next, regions of the metal layer exposed by photoresist are denuded by etching. As shown in FIG. 4, etching forms the excitation electrodes 102a, 102b and extraction electrodes 103a, 103b on both main surfaces and edge surfaces of the quartz-crystal wafer 10W.

In step S103 the quartz-crystal vibrating pieces 10 on the crystal wafer are cut to separate individual devices. During cutting, cuts are made along cut lines CL (denoted by dot-dash lines in FIG. 4) using a dicing unit such as a laser beam or dicing saw.

In protocol S11, the package lid 11 is manufactured. Protocol S11 includes steps S111-S112. In step S111, as shown in FIG. 5, several hundreds to several thousands of lid recesses 111 are formed on a main surface of a lid wafer 11W, the latter being a circular, uniformly planar plate of quartz-crystal material. The lid recesses 111 are formed in the lid wafer 11W by etching or mechanical processing, leaving the first peripheral surfaces M1 around the lid recesses 111.

In step S112, the low-melting point glass LG is printed on the first peripheral surface M1 of the lid wafer 11W by screen-printing. A film of low-melting-point glass is formed on the first peripheral surface M1 of the lid wafer 11W by preliminary curing. The film of low-melting-point glass is not formed on a position 112 which corresponds to the base through-holes BH1 (base castellations 122a to 122d in FIG. 1). Although the low-melting-point glass LG is formed on the package lid 11 in this embodiment, it can alternatively be formed on the second peripheral surface M2 of the package base 12.

In protocol S12, package bases 12 are manufactured. Protocol S12 includes steps S121-S122. In step S121, as shown in FIG. 6, several hundreds to several thousands of base recesses 121 are formed on the base wafer 12W, the latter being a circular, uniformly planar plate of quartz-crystal material. On the base wafer 12W, multiple base recesses 121 are formed by etching or mechanical processing, and the second peripheral surfaces M2 circumscribe the respective base recesses 121. Also formed are rounded-rectangular through-holes BH1 on each edge of the package base 12 in respective X-axis directions. Two castellations are formed on each edge. The through-holes extend depthwise through the base wafer 12W. Whenever a base through-hole BH1 is cut in half during dicing, it forms a respective base castellation 122a-122d (FIG. 1).

In step S122, a foundation layer of chromium (Cr) is formed, followed by formation of an overlying layer of gold (Au) later on both main surfaces of the base wafer 12W by sputtering or etching. Then, as shown in FIG. 6, the connecting electrodes 124a, 124b are formed on the second peripheral surface M2 by etching. Simultaneously, the base edge-surface electrodes 123a-123d are formed on the entire surfaces of the base through-holes BH1 (FIG. 1).

On the lower main surface of the base wafer 12W, a pair of external electrodes 125a, 125c and a pair of grounding electrodes 125b, 125d are formed simultaneously, as shown in FIG. 7. Here, the external electrodes and grounding terminals formed on the package base 12 in adjacent X-axis directions are formed as one unit. Specific explanations are made using four base portions (12A-12D) indicated with surrounding dotted lines. The external electrode 125a on the package base 12B, the grounding electrode 125d on the package base 12C, and the base edge-surface electrodes 123a, 123d on the base through-holes BH1 are formed simultaneously. Also, the external electrode 125c on the package base 12B, the grounding electrode 125b on the package base 12A, and the base edge-surface electrodes 123b, 123c are formed simultaneously. Further, the grounding terminals (external electrodes and grounding electrodes) on the package base 12B are formed at a space SP3 away from the external electrodes and grounding electrodes formed on the package base 12D. Here, the space SP3 is in the range of approximately 40 μm to 280 μm. If, for example, the space SP3 is 40 μm, and if the width of a dicing cut (described later in step S17) is 40 μm, the space SP2 indicated in FIG. 2B would be 0 μm. Consequently, the external electrodes and grounding electrodes formed on the adjacent package bases 12 in the X-axis direction are connected and the external electrodes and grounding electrodes formed on the adjacent package bases 12 in the Z'-axis direction are disconnected.

In step S13, each quartz-crystal vibrating piece 10 (manufactured in protocol S10) is mounted onto the second peripheral surface M2 of the package base 12 formed on the base wafer 12W using electrically conductive adhesive 13. The quartz-crystal vibrating piece 10 is mounted onto the second peripheral surface M2 of the package base 12 so as to align the extraction electrodes 103a, 103b formed on the quartz-crystal vibrating piece 10 with respective connecting electrodes 124a, 124b formed on the second peripheral surface M2 of the package base 12. Thus, several hundreds to several thousands of quartz-crystal vibrating pieces 10 are mounted onto the base wafer 12W.

In step S14, a pair of probes PB1, PB2 (refer to FIG. 7) for measuring vibration frequency is contacted to a pair of external electrodes 125a and 125c on the package base 12. Thus, the vibration frequency of each quartz-crystal vibrating piece 10 is measured.

Referring to FIG. 7, even if an alternating voltage is applied to the external electrodes 125a, 125c on the package base 12B via the probes PB1, PB2, the external electrodes 125a, 125c on the package base 12A, 12C, 12D do not electrically connect with each other. Thus, the package base 12B is not affected by other quartz-crystal vibrating pieces 10 on the package bases 12A, 12C, 12D. This allows the vibration frequency of the quartz-crystal vibrating piece 10 on the package base 12 to be measured accurately, at the wafer stage, before dicing. Also, in step S14, although the probes PB1, PB2 for measuring vibration frequency are brought into contact with the external electrodes 125a, 125c, the probes alternatively can be contacted to the connecting electrodes 124a, 124b or to the base edge-surface electrodes 123a, 123c, for obtaining measurements of the vibration frequency of the quartz-crystal vibrating pieces 10.

In step S15, the thickness of the excitation electrode 102a on the quartz-crystal vibrating piece 10 is adjusted. The thickness can be adjusted by sputtering a metal onto the excitation electrode 102a to increase its mass (and thus to decrease its vibration frequency), or by evaporating some metal from the excitation electrode 102a to decrease its mass (and thus to increase its vibration frequency). This method for adjusting vibration frequency is discussed in Japan Unexamined Patent Document 2009-141825, in which the assignee is the same as the assignee of the present disclosure. If the measured vibration frequency is within its pre-specified proper range, then adjustment of vibration frequency is not required.

The vibration frequency of one quartz-crystal vibrating piece 10 can be measured in step S14, and then the vibration frequency of the one quartz-crystal vibrating piece 10 can be adjusted in step S15. This step is repeated for all quartz-crystal vibrating pieces 10 situated on the base wafer 12W. Also, in step S14, after measuring the vibration frequencies of all the quartz-crystal vibrating pieces 10 situated on the base wafer 12W, in step S15, the vibration frequency of the quartz-crystal vibrating pieces 10 can be adjusted one-by-one.

In step S16 the low-melting-point glass LG is heated as the lid wafer 11W and base wafer 12W are compressed against each other. Thus, the lid wafer 11W and base wafer 12W are bonded together by the low-melting-point glass LG.

In step S17 the bonded-together lid wafer 11W and base wafer 12W is cut up to separate individual quartz-crystal vibrating devices. This cutting is performed by cutting along scribe lines SL, denoted by dot-dash lines in FIGS. 5-7, using a dicing unit such as a laser beam or a dicing saw. Thus, several hundreds to several thousands of quartz-crystal vibrating devices 100 are produced.

Alternative to First Embodiment

<Configuration of the Alternative First Quartz-Crystal Vibrating Device 100'>

Figure 8:
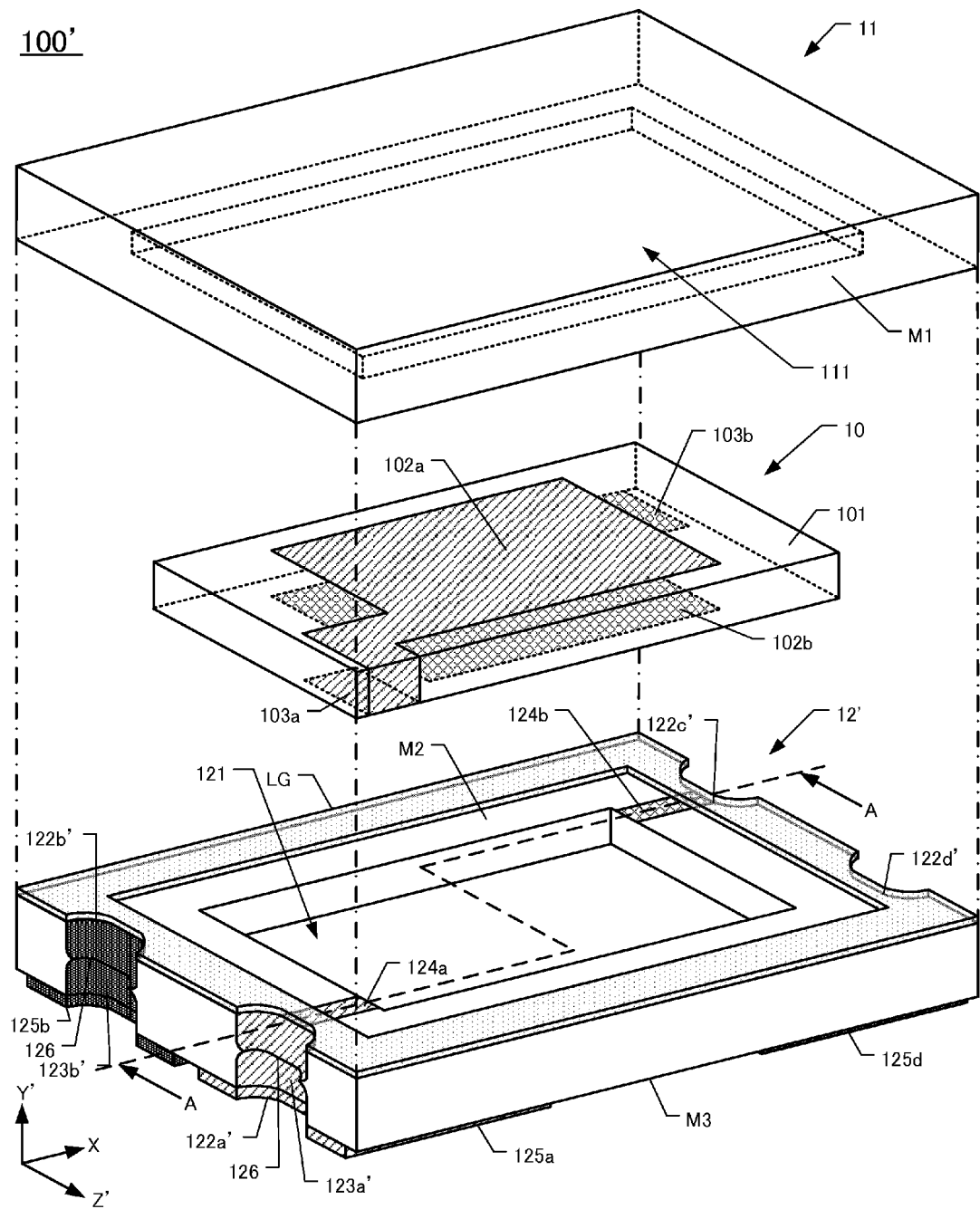
FIG. 8 is an exploded perspective view of the first quartz-crystal vibrating device 100' in the first embodiment.
Figure 9:
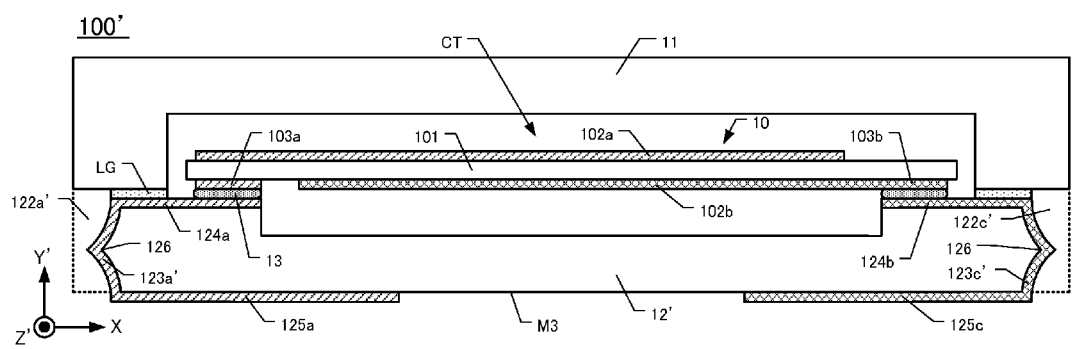
FIG. 9 is a cross-sectional view of FIG. 8 taken along A-A line.

The overall configuration of this alternative configuration of the first embodiment of a quartz-crystal vibrating device 100' is described below with reference to FIGS. 8 and 9. FIG. 8 is an exploded perspective view of the quartz-crystal vibrating device 100', and FIG. 9 is a cross-sectional view, along the line A-A, of the device shown in FIG. 8. In FIG. 8, low-melting-point glass LG used as a sealing material is drawn as being transparent, so that the entire connecting electrodes 124a, 124b can be viewed.

As shown in FIGS. 8 and 9, the quartz-crystal vibrating device 100' comprises a package lid 11, a package base 12', and a quartz-crystal vibrating piece 10. The quartz-crystal vibrating piece 10 is mounted to the package base 12'.

On the package base 12' a respective protruding portion 126 is formed on each base castellation 122a'-122d', at substantially mid-length in the Y'-axis direction and tapering outward.

With this configuration, since the protruding portions 126 are formed on the base castellations 122a'-122d', the duration of sputtering required to form films on the base edge-surface electrodes 123a'-123d' can be shortened.

Although this alternative configuration to the first embodiment was described above in the context of the protruding portion 126, this feature can be applied with equal facility to the second to fourth embodiments and to the alternative configuration to the third embodiment.

<Method for Manufacturing the Alternative to First Embodiment of a Quartz-Crystal Vibrating Device>

Figure 10:
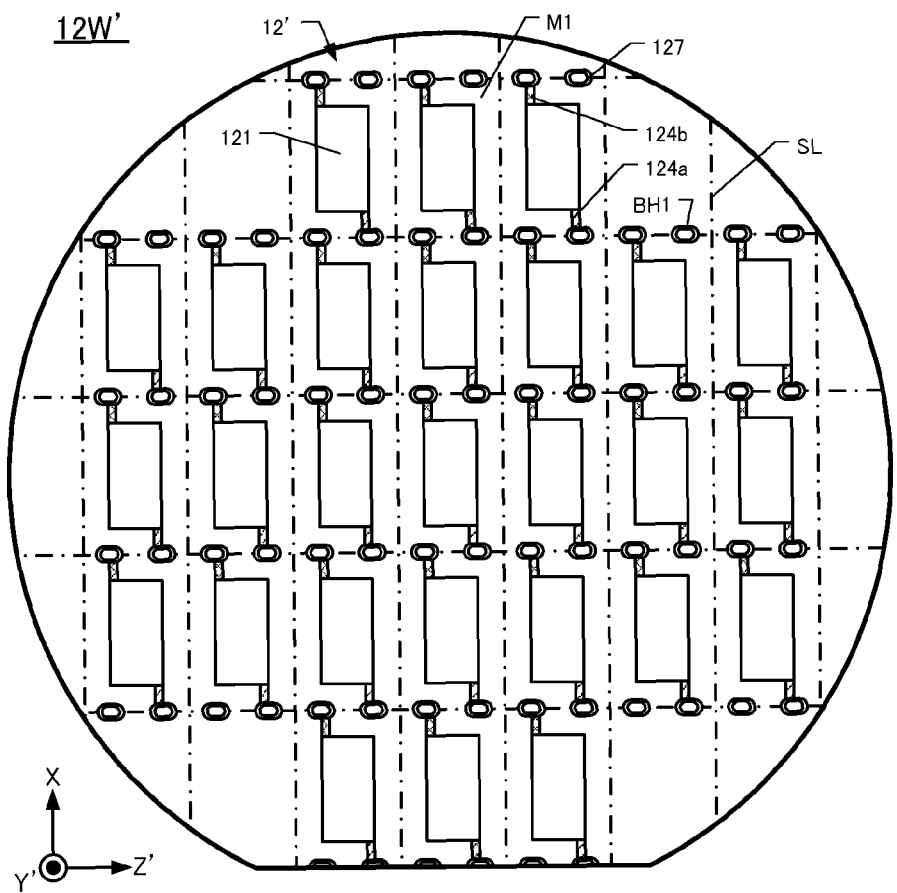
FIG. 10 is a plan view of the base wafer 12W'.

The alternative configuration to the first embodiment of a quartz-crystal vibrating device 100' is manufactured according to a method diagrammed in the flow-chart shown in FIG. 3, except that step S12 for forming the package base 12' follows a different step from that in the method for manufacturing the first embodiment. FIG. 10 is a plan view of the base wafer 12W'.

In step S121 of the alternative method, the base castellations 122a'-122d' are formed by etching from both the +Y'-axis side and the –Y'-axis sides. The base recess 121 is formed simultaneously with etching from the +Y'-axis side. Thus, as shown in FIG. 10, protruding portions 127 are formed in the base through-holes BH1 of the base wafer 12W'. Whenever a protruding region 127 is cut in half, it forms one protruding portion 126 (see also FIGS. 8 and 9).

In step S122 of the alternative method, the base edge-surface electrodes 123a'-123d' are formed on the base castellations 122a'-122d' by sputtering from the +Y'-axis and –Y'-axis sides. Since the protruding region 127 is formed on the base through-hole BH1, the base edge-surface electrodes 123a'-123d' can be formed in a shorter time (refer to FIGS. 8 and 9).

Second Embodiment

<Configuration of the Second Quartz-Crystal Vibrating Device>

Figure 11:
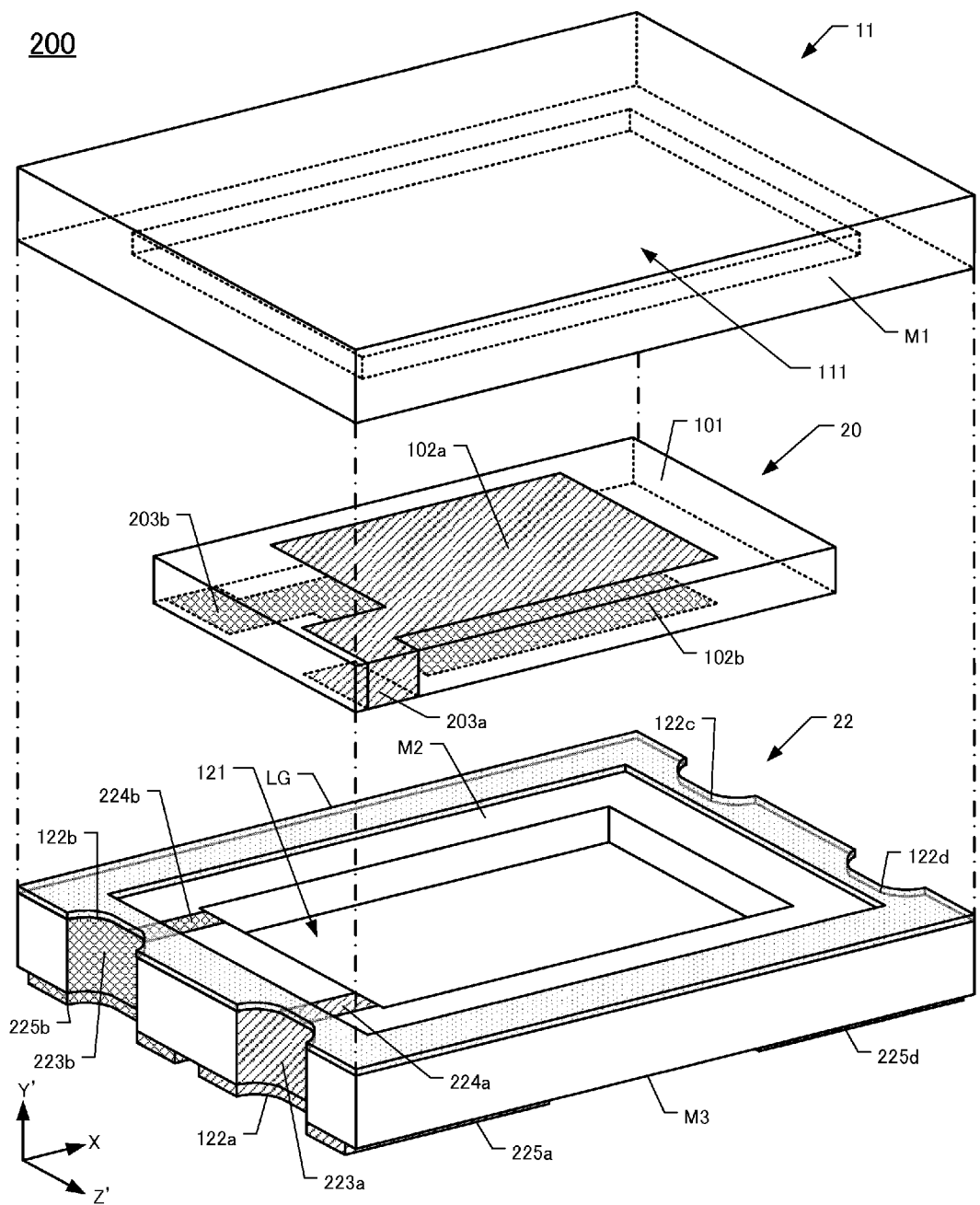
FIG. 11 is an exploded perspective view of the second quartz-crystal vibrating device 200.
Figure 12:
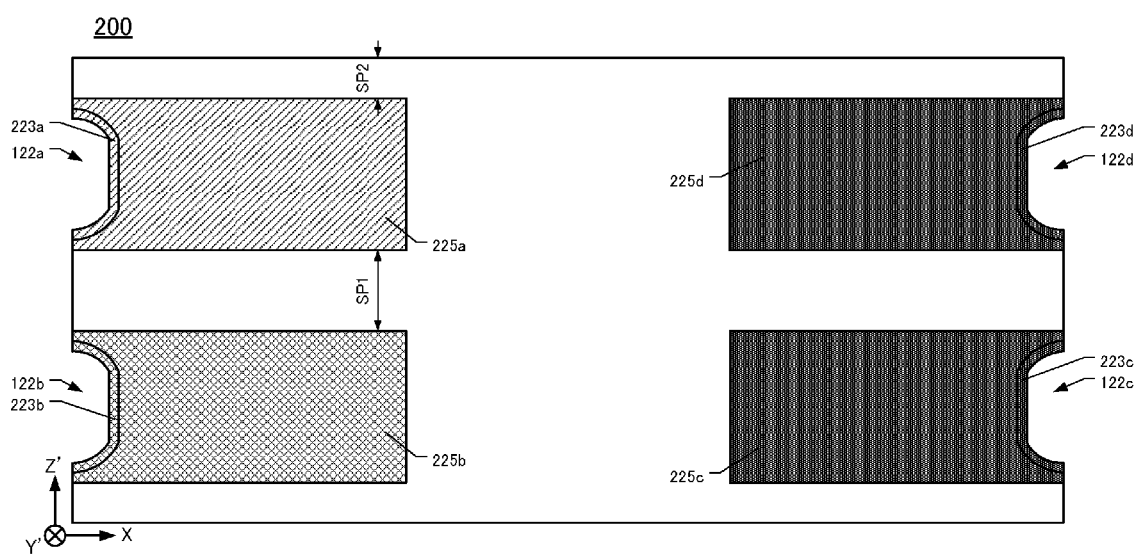
FIG. 12 is a plan view of the lower surface of a quartz-crystal vibrating device according to the second embodiment.

The general configuration of the second embodiment of a quartz-crystal vibrating device 200 is described below with reference to FIGS. 11 and 12. FIG. 11 is an exploded perspective view of the device 200, and FIG. 12 is a plan view of the lower main surface of the device 200. In FIG. 11, a low-melting-point glass LG used as a sealing material is drawn as being transparent, thereby allowing the entire connecting electrodes 224a, 224b two be viewed. In this embodiment, components that are similar to corresponding components of the first embodiment have the same respective reference numerals and are not described further below.

As shown in FIGS. 11 and 12, the second embodiment of a quartz-crystal vibrating device 200 comprises a package lid 11, a package base 22, and a planar quartz-crystal vibrating piece 20 mounted on the package base 22.

The quartz-crystal vibrating piece 20 comprises an AT-cut quartz-crystal piece 101. A pair of excitation electrodes 102a, 102b is situated substantially in the center of the quartz-crystal piece 101, in which the electrodes oppose each other. The excitation electrode 102a is connected to an extraction electrode 203a, extending in the –X-axis direction, and to the lower main surface (+Z'-axis surface) of the quartz-crystal piece 101. The excitation electrode 102b is connected to an extraction electrode 203b, extending in the –X-axis direction, to the lower main surface (–Z'-axis side surface) of the quartz-crystal piece 101. The shape of the extraction electrode on the vibrating piece 20 is different from the shape of the extraction electrode on the vibrating piece 10 in the first embodiment.

On each edge of the package base 22 in both X-axis directions, a respective pair of base castellations 122a-122d is situated. These castellations are formed simultaneously with formation of the base through-holes BH1 (FIG. 12). Also, the base edge-surface electrodes 223a-223d are disposed in respective base castellations 122a-122d.

Connecting electrodes 224a, 224b, formed on the second peripheral surface M2, are connected to the respective base edge-surface electrodes 223a-223b on the –X-axis edge surface of the package base 22, aligned with the quartz-crystal vibrating piece 20. On the mounting surface M3 of the package base 22 in the –X-axis direction are a pair of external electrodes 225a, 225b that are connected to the respective base edge-surface electrodes 223a, 223b. Base edge-surface electrodes 223c, 223d formed on the mounting surface M3 of package base 22 in the +X-axis direction are connected to respective grounding electrodes 225c, 225d situated on the mounting surface M3 of the package base 22 in the +X-axis direction.

As shown in FIG. 12, the external electrodes 225a, 225b grounding electrodes 225c, 225d are disposed separate from each other. The external electrodes 225a, 225b are separated by a space SP1, and the grounding electrodes 225c, 225d are separated by a similar space. The space SP1 is in the range of 200 μm to 500 μm in the Z'-axis direction, for example. The external electrode 225a and the grounding electrode 225d are each spaced inboard (SP2) of the adjacent edge of the package base 22 in the +Z'-axis direction. Similarly, the external electrode 225b and the grounding electrode 225c are each spaced inboard (SP2) of the adjacent edge of the package base 22 in the –Z-axis direction. The space SP2 is, for example, 0 μm to 100 μm.

In this embodiment 200, the quartz-crystal vibrating piece 20 is mounted on the second peripheral surface M2 of the package base 22 using electrically conductive adhesive 13 (FIG. 2A). The extraction electrodes 203a, 203b of the quartz-crystal vibrating piece 20 are electrically connected to the respective connecting electrodes 224a and 224b on the package base 22. Thus, the external electrodes 225a, 225b are electrically connected to the respective excitation electrodes 102a, 102b via the respective base edge-surface electrodes 223a, 123b, the respective connecting electrodes 224a, 224b, the electrically conductive adhesive 13, and the respective extraction electrodes 203a, 203b.

<Method for Manufacturing the Second Embodiment of a Quartz-Crystal Vibrating Device>

The method for manufacturing the second embodiment of a quartz-crystal vibrating device 200 essentially follows the flow-chart in FIG. 3 diagramming the method for manufacturing the first embodiment of a quartz-crystal vibrating device 100. However, as shown in FIG. 13, when forming package bases 22 on the base wafer 22W, the respective positions of the external electrodes and the grounding electrodes differ from the corresponding positions in the first embodiment.

Figure 13:
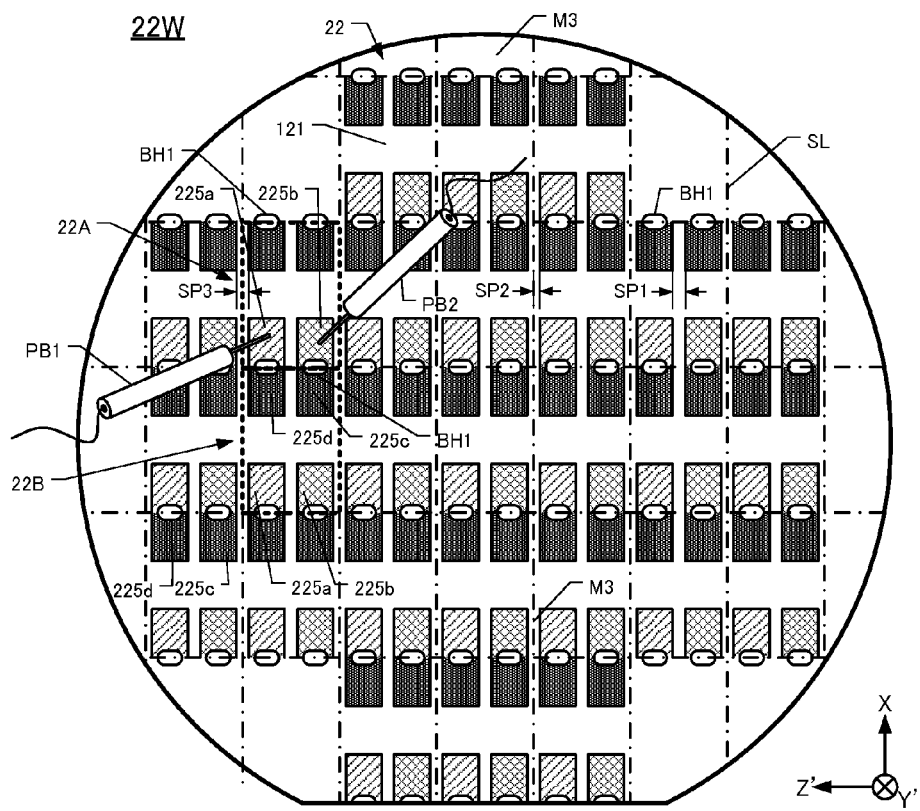
FIG. 13 is a plan view of the lower main surface of a base wafer used in a method for manufacturing the second embodiment.

FIG. 13 is a plan view of a lower main surface of the base wafer 22W, on which a plurality of package bases 22 are manufactured simultaneously. The external electrode 225a and the grounding electrode 225d, formed on adjacent package bases 22A, 22B in the X-axis direction, are formed as one unit. The mounting terminals (external electrodes and grounding electrodes) formed in the adjacent Z'-axis directions are formed apart from each other, and the space SP3 in the Z'-axis direction is in the range of approximately 40 μm to 280 μm.

Hence, whenever probes PB1, PB2 for measuring vibration frequency are contacted to the external electrodes 225a, 225b on the package base 22A, the vibration frequency of each quartz-crystal vibrating piece 20 is measured. Even if an alternating voltage is applied from the probes PB1, PB2 to the external electrodes 225a, 225b on the package base 22A, the external electrodes 225a, 225b only connect to the grounding electrodes 225c, 225d on the package base 22B without making electrical connection to the quartz-crystal vibrating piece 20 on the package base 22B. Therefore, the vibration frequency of the quartz-crystal vibrating piece 20 on the package base 22 can be measured accurately at the wafer level before dicing.

Third Embodiment

<Configuration of the Third Quartz-Crystal Vibrating Device>

Figure 14:
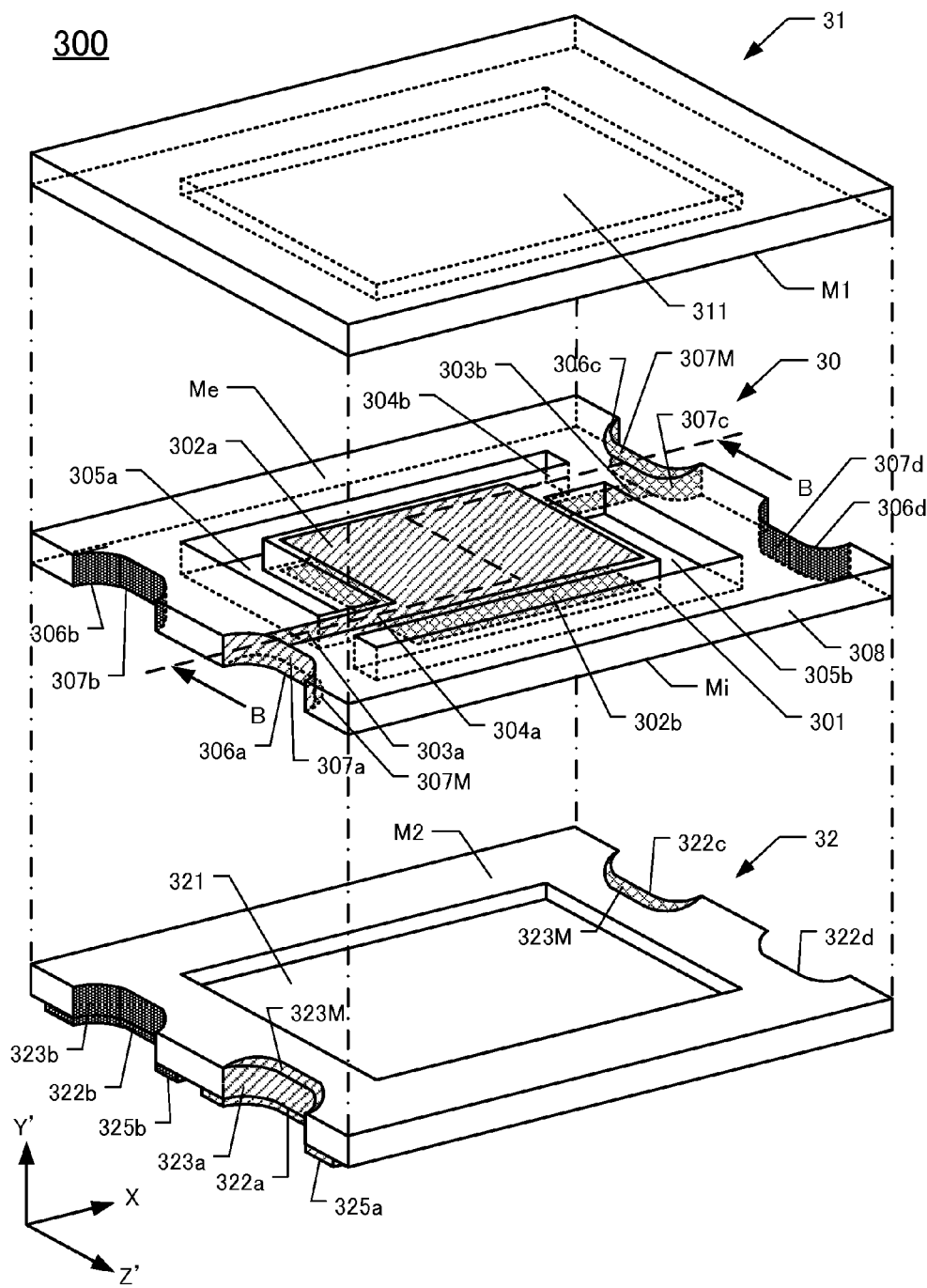
FIG. 14 is an exploded perspective view of the third quartz-crystal vibrating device 300 in the third embodiment.
Figure 15:
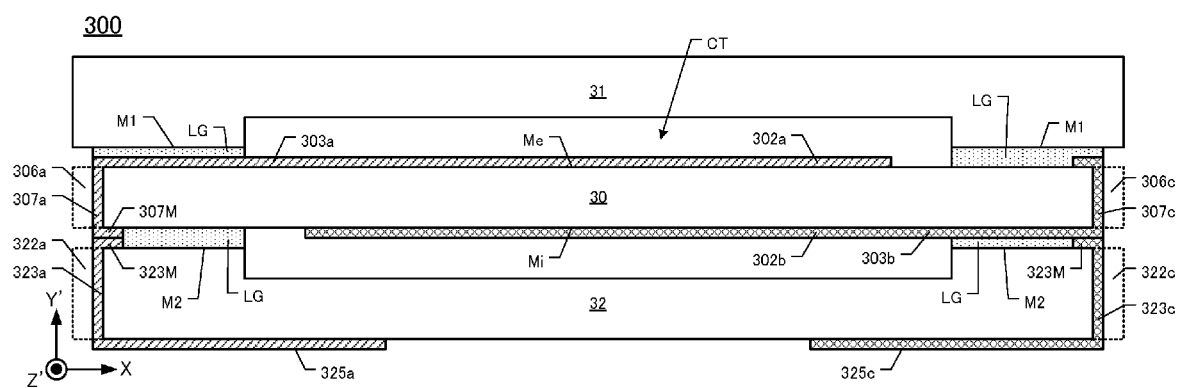
FIG. 15 is a cross-sectional view of FIG. 14 taken along B-B line.

The general configuration of the third embodiment of a quartz-crystal vibrating device 300 is described below with reference to FIGS. 14 and 15. FIG. 14 is an exploded perspective view of the vibrating device 300, and FIG. 15 is a cross-sectional view along the line B-B in FIG. 14.

This embodiment of a vibrating device 300 comprises a package lid 31 (defining a lid recess 311), a package base 32 (defining a base recess 321), and a quartz-crystal vibrating piece 30 sandwiched between the package lid 31 and the package base 32.

The quartz-crystal vibrating piece 30 comprises a quartz-crystal vibrating portion 301 including a respective excitation electrode 302a, 302b on each main surface thereof. An outer frame 308 surrounds the quartz-crystal vibrating portion 301. Between the vibrating portion 301 and the outer frame 308 are respective supporting portions 304a, 304b extending from the vibrating portion 301 along both edges in the X-axis directions. This leaves a pair of L-shaped voids 305a, 305b situated between the vibrating portion 301 and the outer frame 308. Rounded-rectangular castellations 306a-306d are situated on respective edges of the vibrating piece 30 in respective X-axis directions and extending in the Z'-axis directions. Two castellations are formed on each edge. These castellations were originally formed as rounded-rectangular through-holes CH (refer to FIG. 17). On each quartz-crystal castellation 306a-306b is a respective quartz-crystal edge-surface electrode 307a-307d.

An extraction electrode 303a is formed on the first surface Me of the supporting portion 304a, which connects one edge in the (−X-axis direction) of the vibrating piece 30 to the quartz-crystal edge-surface electrode 307a formed on the other edge in the +Z-axis direction. The quartz-crystal edge-surface electrode 307a desirably extends to the second surface Mi of the vibrating piece 30 and connects to the connecting pad 307M. The connecting pad 307M is electrically connected to the connecting pad 323M of the base edge-surface electrode 323a, which is described later below. Similarly, on the second surface Mi of the joining portion 304b, an extraction electrode 303b connects the respective excitation electrode 302b to the quartz-crystal edge-surface electrode 307c on the vibrating piece 30 in the +X-axis direction and on the −Z-axis side surface. The extraction electrode 303b is electrically connected to the connecting pad 323M of the base edge-surface electrode 323b, which is described later below.

The package base 32 is fabricated from glass or quartz-crystal material, and comprises a second peripheral surface M2 on the first main surface (+Y'-axis edge surface) surrounding the base recess 321. On both edges of the package base 32 in the X-axis directions are respective base castellations 322a-322d, two castellations on each edge. These castellations were originally formed as base through-holes CH (FIGS. 6 and 7). On each base castellation 322a-322d is a respective base edge-surface electrode 323a-323d. The base edge-surface electrode 323a, situated on the package base 32 in the −X-axis direction and on the +Z'-axis side, is connected to the connecting pad 307M situated on the vibrating piece 30 via the connecting pad 323M on the second peripheral surface M2. Thus, the base edge-surface electrode 323a is connected to the extraction electrode 303a via the connecting pad 307M and the quartz-crystal edge-surface electrode 307a. Also, the base edge-surface electrode 323c situated on the package base 32 in the +X-axis direction and on the −Z'-axis side is connected to the extraction electrode 303b on the vibrating piece 30.

On the package base 32, two external electrodes 325a, 325c, and two grounding electrodes 325b, 325d are situated in diagonal relationship to each other on the mounting surface M3 (see FIG. 2). Each external electrode 325a, 325c is connected to the respective base edge-surface electrode 323a, 323c that is connected to the respective extraction electrode 303a, 303b on the vibrating piece 30. Each grounding electrode 325b, 325d is connected to the respective base edge-surface electrode 323b, 323d.

As shown in FIG. 15, the package lid 31, outer frame 308, and the package base 32 bonded together define a cavity CT in which the quartz-crystal vibrating piece 30 is situated. The package lid 31, the vibrating piece 30, and the package base 32 are sealed together using a sealing material of, for example, low-melting-point glass.

The third embodiment is similar to the first embodiment in that a pair of external electrodes and a pair of grounding electrodes are disposed diagonally from each other on the mounting surface of the vibrating device 300. The third embodiment is also similar to the second embodiment and that a pair of external electrodes or a pair of grounding electrodes is disposed on one side.

<Method for Manufacturing the Third Embodiment of a Quartz-Crystal Vibrating Device>

Figure 16:
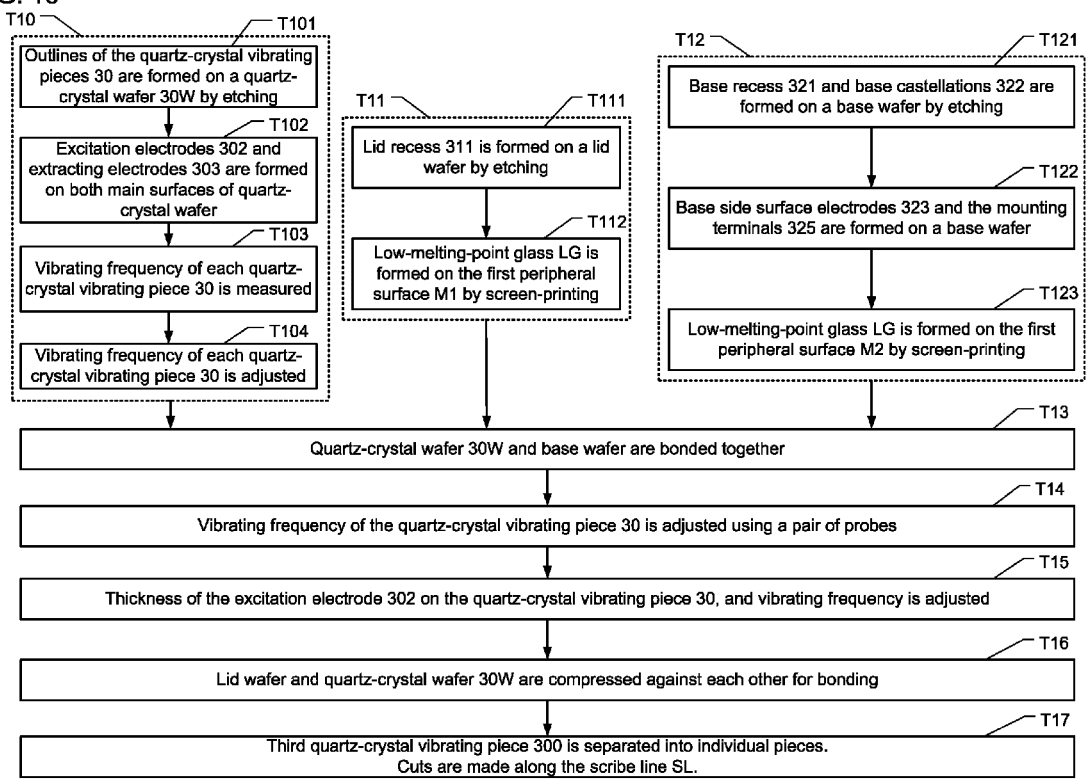
FIG. 16 is a flow-chart showing the manufacturing method of the third quartz-crystal vibrating device 300.
Figure 17:
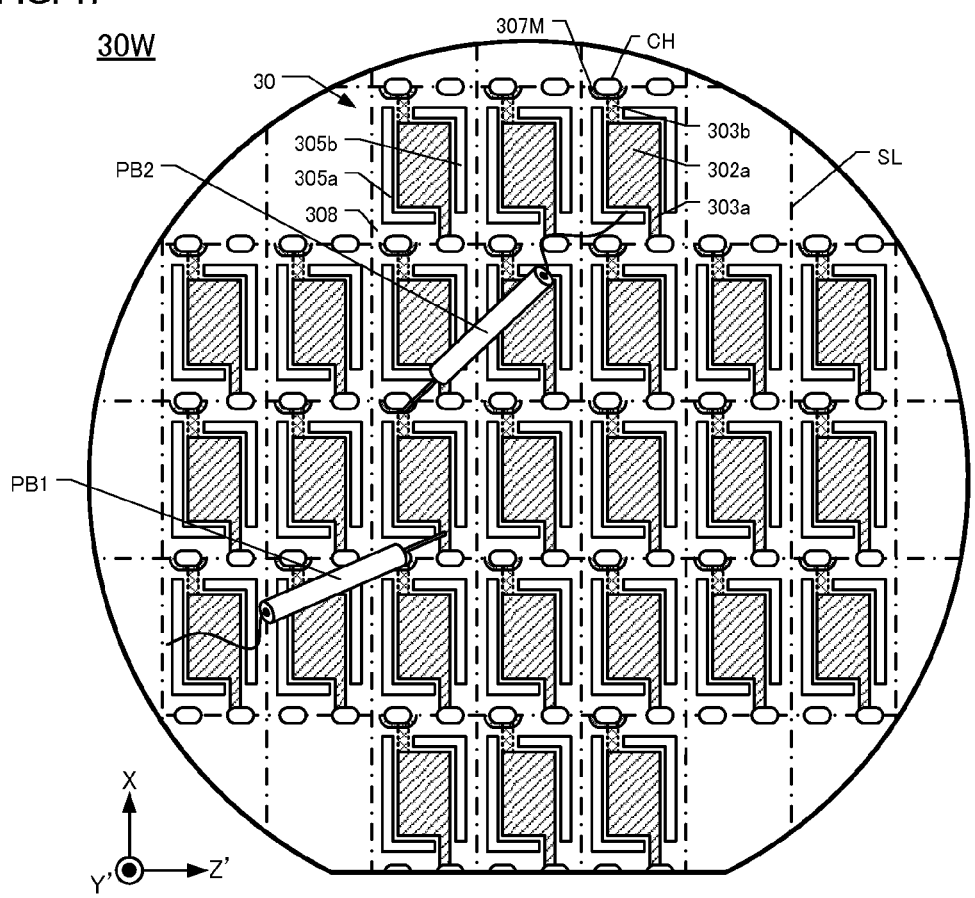
FIG. 17 is a plan view of the quartz-crystal wafer 30W.

This embodiment of a method for manufacturing the third embodiment of a quartz-crystal vibrating device 300 is described below with reference to FIG. 16. FIG. 16 is a flow-chart of the method. FIG. 17 is a plan view of the quartz-crystal wafer 30W, on which a plurality of vibrating pieces 30 can be manufactured simultaneously.

In protocol T10, a quartz-crystal vibrating piece 30 is manufactured. Protocol T10 includes steps T101-T104. In step T101 (FIG. 17), the profile outlines of a plurality of quartz-crystal vibrating pieces 30 are formed on the planar quartz-crystal wafer 30W by etching, thereby forming a quartz-crystal vibrating portion 301, an outer frame 308, and voids 305a, 305b are formed. On respective edges of each vibrating piece 30 in the X-axis directions, two through-holes CH are formed simultaneously. The through-holes CH extend depthwise through the wafer 30W. Whenever the through-holes CH are cut in half during dicing, they forms respective castellations 306a-306d (FIG. 14).

In step T102 the excitation electrodes 302a, 302b and extraction electrodes 303a, 303b are formed on both main surfaces and edge surfaces of the quartz-crystal wafer 30W.

In step T103, probes PB1, PB2 for measuring vibration frequency are contacted to respective extraction electrodes 303a, 303b on the vibrating piece 30. Thus, the vibration frequency of each vibrating piece 10 is measured.

In step T104 the thickness of the excitation electrode 302a on the quartz-crystal vibrating piece 30 is adjusted. The thickness can be adjusted by sputtering a metal onto the excitation electrode 302a to increase its mass (and to decrease its vibration frequency), or by evaporating some metal from the excitation electrode 302a to decrease its mass (and to increase its vibration frequency).

In protocol T11, multiple package lids 31 are manufactured. Protocol T11 includes steps T111 and T112. In step T111, a profile outline of the package lid 31 is formed. In step T12, low-melting-point glass LG is applied to the peripheral surface M1 of the package lid 31 (FIG. 15).

In protocol T12, multiple package bases 32 are manufactured. Protocol T12 includes steps T121-T123. In step T121, a profile outline of the package base 32 is formed, and respective electrodes are formed in step T122. In step T123, low-melting-point glass LG is applied to the second peripheral surface M2 of the package base 32.

In step T13, the quartz-crystal wafer having multiple quartz-crystal vibrating pieces 30 is bonded to the base wafer having multiple package bases 32 using the low-melting-point glass LG. During this bonding the connecting pad 307M on the quartz-crystal wafer 30W is bonded to the connecting pad 323M on the base wafer, and the extraction electrode 303b on the quartz-crystal wafer 30W is bonded to the connecting pad 323M on the base wafer.

In step T14, probes PB1, PB2 for measuring vibration frequency are contacted to respective external electrodes 325a, 325c on the same package base 32. Thus, the vibration frequency of each vibrating portion 301 is measured. Even if an alternating voltage is applied to the external electrodes 325a, 325c, the external electrodes 325a, 325c only connect to the adjacent grounding electrodes 325b, 325d on the package base 32 and do not electrically connect to the external electrodes 325a, 325c. Hence, the vibration frequency of the vibrating portion 301 can be measured accurately at the wafer level before dicing.

In step T15, as shown in FIG. 3 (step S15 of the first embodiment), the thickness of the excitation electrode 302a of the vibrating portion 301 is adjusted. In step T16 the applied low-melting-point glass LG is heated as the lid wafer and crystal wafer 30W are compressed against each other. Thus, the lid wafer and quartz-crystal wafer 30W are bonded together by the low-melting-point glass LG. In step T17 the bonded-together unit of the lid wafer, the crystal wafer 30W and the base wafer is cut up into separate individual pieces. Thus, several hundreds to several thousands of third quartz-crystal vibrating devices 300 are produced.

In step T12 of the third embodiment, the base edge-surface electrodes 323a-323d, external electrodes 325a, 325c, and grounding electrodes 325b, 325d are formed on the package base 32. Then in step T13, the crystal wafer and the base wafer are bonded together. However, after bonding the crystal wafer and the base wafer (lacking electrodes) together, respective base edge-surface electrodes 323a-323d, external electrodes 325a, 325c, and grounding electrodes 325b, 325b can be formed by sputtering. Thus, the connecting pad 323M on the package base 32, shown in FIGS. 14 and 15, need not be formed. This manufacturing method can be also applied to the alternative configuration of the third embodiment, described below.

Alternative to Third Embodiment

<Configuration of the Alternative to Third Quartz-Crystal Vibrating Device>

Figure 18A:
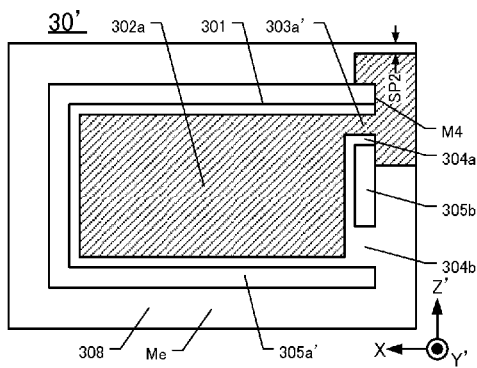
FIG. 18A is a plan view of an embodiment of a quartz-crystal vibrating piece, as viewed from above its +Y'-axis side.
Figure 18B:
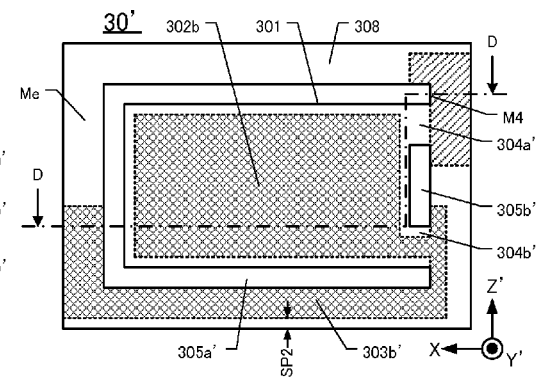
FIG. 18B is a plan view of the embodiment of a quartz-crystal vibrating piece, as viewed from its –Y'-axis side.
Figure 18C:
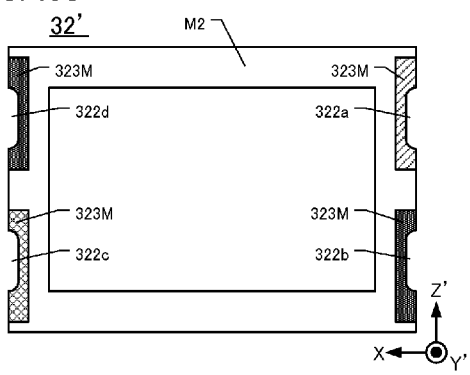
FIG. 18C is a plan view of the package base 32' viewed from the +Y'-axis side.
Figure 18D:
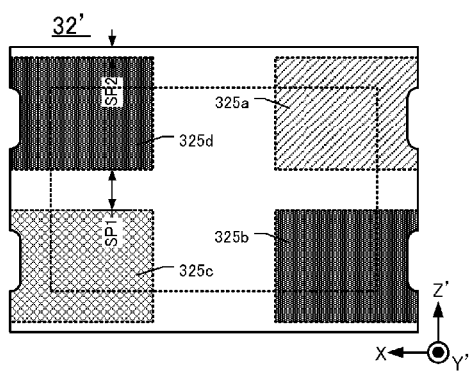
FIG. 18D is a perspective view of the package base 32' viewed from the +Y'-axis side.
Figure 19:
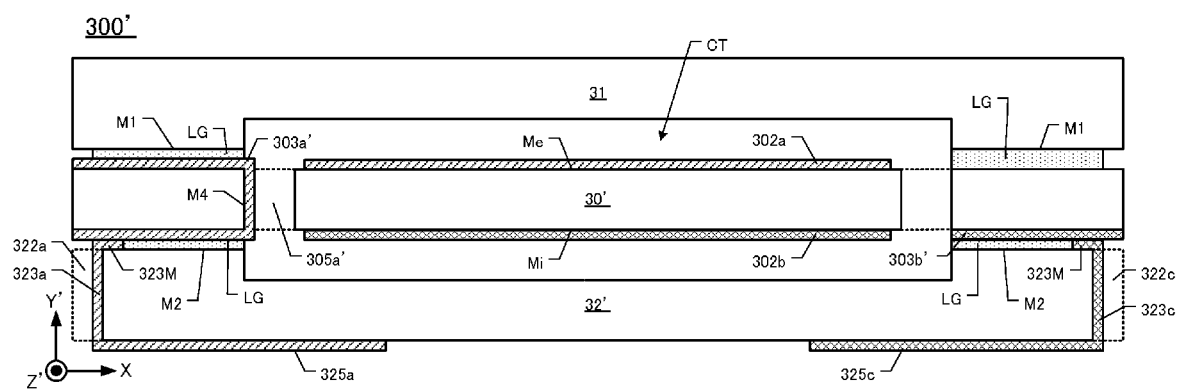
FIG. 19 is a cross-sectional view of FIG. 18B taken along D-D line.
Figure 20A:
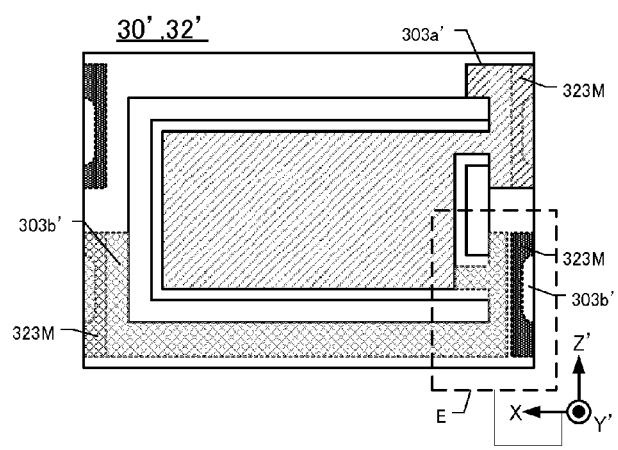
FIG. 20A is a plan view of the quartz-crystal vibrating device 300' viewed from the +Y'-axis side.

The general features of this alternative configuration 300' of the third embodiment of a quartz-crystal vibrating device 300 is described with reference to FIGS. 18A-18D, 19, and 20A-20B. FIG. 18A is a plan view of the quartz-crystal vibrating piece 30' viewed from its +Y'-axis side. FIG. 18B is a perspective view of the vibrating piece 30' viewed from its +Y'-axis side. FIG. 18C is a plan view of the package base 32' viewed from its +Y'-axis side. FIG. 18D is a perspective view of the package base 32' viewed from its +Y'-axis side. FIG. 19 is a cross-sectional view along the line D-D in FIG. 18A. FIG. 20A is a plan view of the alternative configuration 300' viewed from its +Y'-axis side. In FIG. 20A, the package lid 31 is not shown. Also, in FIG. 20A, the vibrating piece 30' is drawn as being transparent so that the package base 32' can be viewed.

Referring first to FIGS. 18A and 18B, the vibrating piece 30' of the quartz-crystal vibrating device 300' comprises a vibrating portion 301 including respective excitation electrodes 302a, 302b on both main surfaces thereof and an outer frame 308 surrounding the vibrating portion 301. Between the vibrating portion 301 and the outer frame 308, a pair of supporting portion 304a', 304b' is situated. The supporting arms extend from the vibrating portion 301 in the −X-axis direction. Thus, between the vibrating portion 301 and the outer frame 308, a rectangular void 305a' is defined that extends in the −X-axis direction. Also, between the supporting portion 304a', 304b', a rectangular void 305b' is defined.

In FIG. 19, the extraction electrode 303a' (formed on the first surface Me of the vibrating piece 30' and connected to the excitation electrode 302a) extends completely from the first surface Me to the second surface Mi of the vibrating piece 30' via the edge surface M4 on the void 305a'.

Returning to FIGS. 18A and 18B, the extraction electrode 303a' (on the vibrating piece 30' and extending to the second surface Mi) is formed on one corner of the vibrating piece 30' on the +Z'-axis side and in the −X-axis direction. Since multiple quartz-crystal vibrating pieces 30' are manufactured on a wafer scale, the extraction electrode 303a' is disposed a space SP1 away from one edge of the vibrating piece 30' in the +Z'-axis side, so as to prevent it from adversely affecting the adjacent quartz-crystal vibrating piece 30'.

The extraction electrode 303b' on the second surface Mi of the vibrating piece 30' extends from the vibrating portion 301 in the −X-axis direction and is formed on one corner of the vibrating piece 30' on the −Z'-axis side and in the +X-axis direction. Since multiple quartz-crystal vibrating pieces 30' are manufactured on a wafer scale, the extraction electrode 303b' is disposed a space SP1 away from one edge of the vibrating piece 30' on the −Z'-axis side, so as to prevent it from adversely affecting the adjacent quartz-crystal vibrating piece 30'.

Referring now to FIGS. 18C and 18D, the package base 32' in this alternative configuration is essentially similar to the package base 32 in the third embodiment. However, in this alternative configuration, the base edge-surface electrodes 323b, 323d (FIG. 14) connected to the grounding electrodes 325b, 325d extend to the second peripheral surface M2 of the package base 32', thus forming the connecting pad 323M.

Also, as shown in FIG. 20A, the package lid 31 (FIG. 14), the vibrating piece 30', and the package base 32' are bonded together, which simultaneously bonds the extraction electrodes 303a', 303b' of the vibrating piece 30' to the external electrodes 325a, 325c of the connecting pad 323M. Thus the respective external electrodes 325a, 325c of the package base 32' are connected to the respective excitation electrodes 302a, 302b of the vibrating piece 30'.

Preferably, the extraction electrode 303b' on the second surface Mi (and extending through the outer frame 308), and the connecting pad 323M formed on the second peripheral surface M2 (and connected to the base castellation 322b) are formed separate from the connecting pad 323M. This is because, whenever multiple package bases 327 are formed on a wafer, the grounding electrode 325b (connected to the base castellation 322b) is connected to the external electrode 325c of the adjacent package base 32' (see FIG. 7).

Figure 20B:
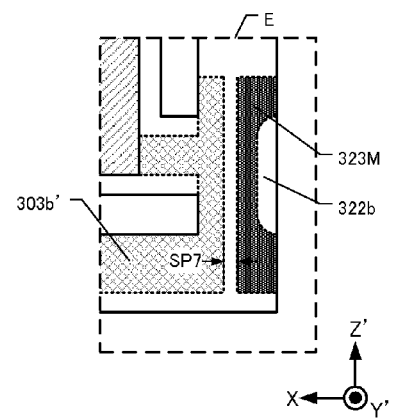
FIG. 20B is an enlarged view of the region "E" of FIG. 20A.

Therefore, as shown in FIG. 20B, the extraction electrode 303b' desirably is formed separately from the connecting pad 323M (connected to the base castellation 322b by a space SP7 in the X-axis direction). The space SP7 is approximately 10 μm wide. In FIGS. 20A-20B, although the extraction electrode 303b' and the connecting pad 323M on the −X-axis direction are placed apart from each other in the X-axis directions, these features do not need to be formed apart. Thus, the space SP7 in the X-axis direction need not be formed if the extraction electrode 303b' and the connecting pad 323M in the −X-axis direction are cut off due to the application of the low-melting-point glass LG in the Y'-axis direction. A joining electrode (not shown) covering a part or all of the external electrode 325c (FIG. 18D), the base edge-surface electrode 323c, and the extraction electrode 303b', desirably is formed so that the extraction electrode 303b' and the connecting pad 323M in the +X-axis direction are assuredly connected together. This minimizes the length of the outer frame 308 and allows forming a larger quartz-crystal vibrating portion 301.

The method for manufacturing the alternative configuration of the third embodiment of a vibrating device 300' essentially follows the method in the third embodiment, and further description thereof is omitted.

Fourth Embodiment

<Configuration of the Fourth Quartz-Crystal Vibrating Device>

Figure 22A:
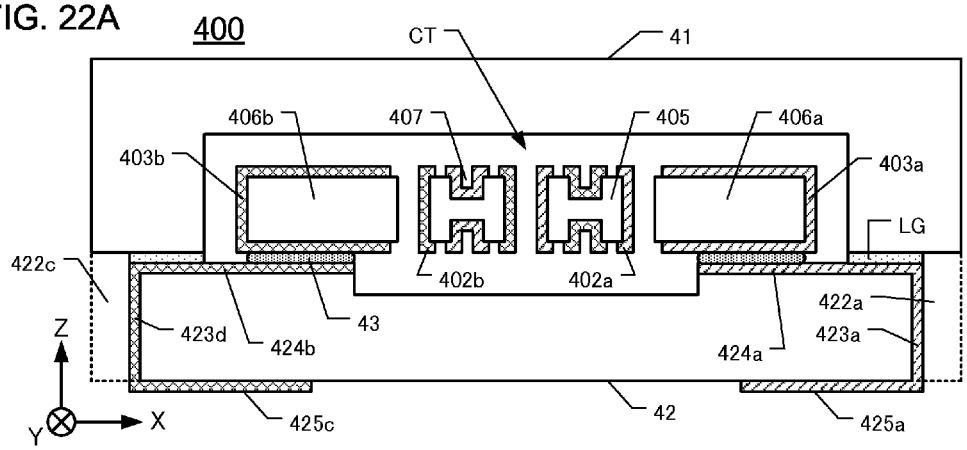
FIG. 22A is a cross-sectional view along the line C-C in FIG. 21.

The general configuration of this fourth embodiment of a quartz-crystal vibrating device 400 is described with reference to FIGS. 21 and 22. FIG. 21 is an exploded perspective view of the vibrating device 400, FIG. 22A is a cross-sectional view along the line C-C in FIG. 21, and FIG. 22B is a plan view of the lower main surface of the vibrating device 400. In FIG. 21, the low-melting-point glass LG used as a sealing material is drawn as being transparent, so that the entire connecting electrodes 124a, 124b can be viewed.

The vibrating device 400 comprises a tuning-fork type quartz-crystal vibrating piece 40. Consequently, its coordinates do not correspond to the AT-cut coordinates used in the previous embodiments. Therefore, in FIGS. 21, 22A-22B, and 23-25, the same X-axis direction is used, but the extension direction of the vibrating arms 205 is referred to as the Y-axis direction, and the direction normal to both the X-axis direction and the Y-axis direction is referred to as the Z-axis direction.

Figure 22B:
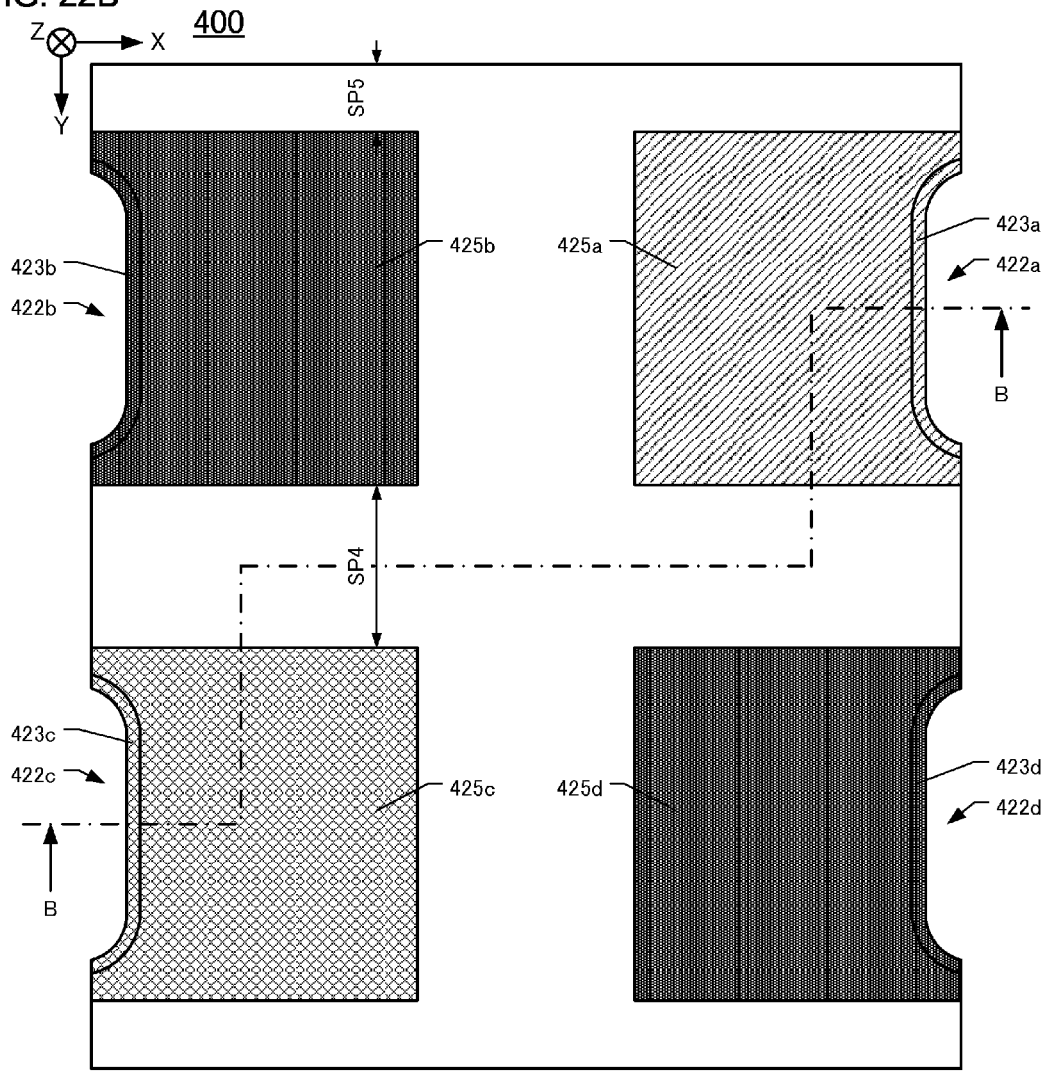
FIG. 22B is a plan view of the lower main surface of a quartz-crystal vibrating piece according to the fourth embodiment.

As shown in FIGS. 21 and 22A-22B, the vibrating device 400 comprises a package lid 41 defining a lid recess 411, a package base 42 in defining a base recess 422, and a tuning-fork type quartz-crystal vibrating piece 40 mounted to the package base 42. The vibrating piece has a pair of vibrating arms 405. The package lid 41 has substantially the same configuration as the package lids used in the first to third embodiments.

The vibrating piece 40 comprises a base 404 formed on the −Y-axis side of the vibrating arms 205. The base 404 has a nearly rectangular-shape as viewed from the Z-axis direction. The vibrating arms 205 extend from one edge of the base 404 in the +Y-axis direction. The cross-section of the vibrating arms 405 is nearly rectangular in shape, and a respective excitation electrode 402a, 402b is formed on each first surface, second surface, and on both edge surfaces. A respective groove 407, extending in the Y-axis direction, is formed on the first surface and second surface of each vibrating arm 405. The weights 408 are formed on the distal tips of the vibrating arms 405 in the +Y-axis direction. The weights 408 allow the vibrating arms 405 on the vibrating piece 40 to vibrate more easily. The weights 408 also facilitate adjustment of vibration frequency of the arms. The tuning-fork type quartz-crystal vibrating piece 40 is distinctly small, and exhibits a vibration frequency of, for example, 32.768 kHz.

The tuning-fork type quartz-crystal vibrating piece 40 comprises supporting arms 406a, 406b. Each supporting arm extends from the base 404 outward in the X-axis direction and then in the Y-axis direction to about mid-length of the vibrating piece 40. The distal tip of each supporting arm 406a, 406b extends further in the X-axis directions. The supporting arms 406a, 406b prevent vibrations produced by the vibrating arms 405 from propagating outside the quartz-crystal vibrating device 400. The supporting arms 406a, 406b also enhance the resistance of the vibrating piece to physical and thermal shocks while being mounted inside the cavity CT (FIG. 22A). The base 404, vibrating arms 405, and supporting arms 406a, 406b are formed at the same thickness and are formed simultaneously by wet-etching.

On the vibrating piece 40, respective extraction electrodes 403a, 403b are formed on each main surface and extend from the respective vibrating arms 405 to the distal ends of the respective supporting arms 406a, 406b. The extraction electrodes 403a, 403b are connected to respective excitation electrodes 402a, 402b on the vibrating arms 405.

Figure 24:
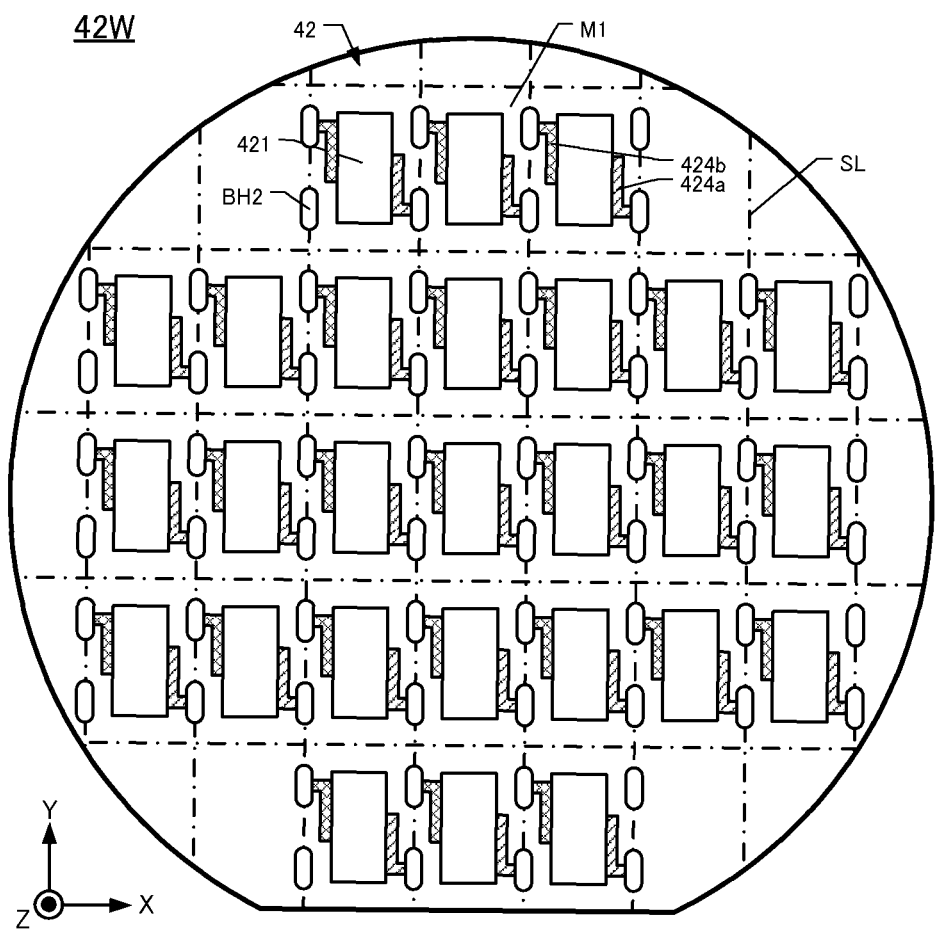
FIG. 24 is a plan view of a base wafer 42W used for manufacturing the fourth embodiment.
Figure 25:
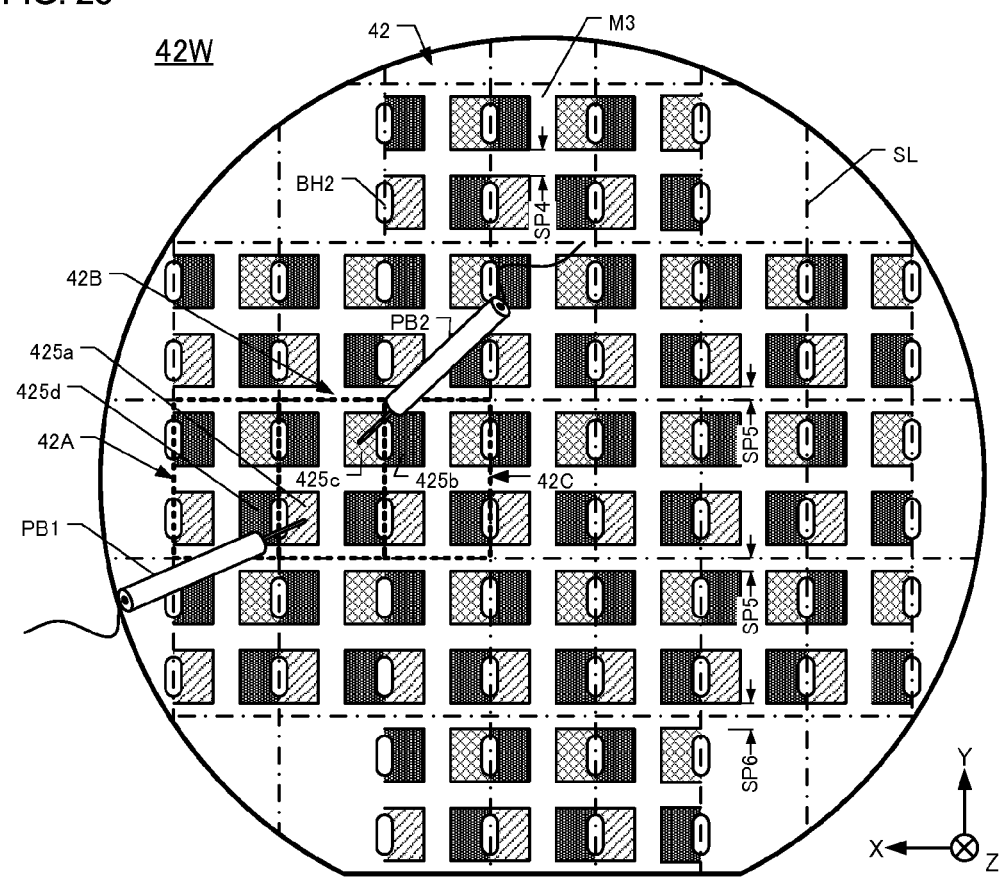
FIG. 25 is a plan view of the lower main surface of a base wafer used for manufacturing the fourth embodiment.

The package base 42 comprises a second peripheral surface M2 extending around the periphery of the first surface (main surface in the +Z-axis direction) of the base recess 421. The package base also includes base castellations 422a-422d; two castellations are formed on each edge of the package base 42 in respective X-axis directions. These castellations are originally formed as base through-holes BH2 (FIGS. 24 and 25). On the base castellations 422a-422d are respective base edge-surface electrodes 423a-423d. Also, the base edge-surface electrode 423a, formed on the package base 42 in the +X-axis direction facing the −Y-axis side, is connected to a respective connecting electrode 424a located on the second peripheral surface M2. Also the base edge-surface electrode 423c, formed on the package base 42 in the −X-axis direction facing the +Y-axis side, is connected to a respective connecting electrode 424b located on the second peripheral surface M2.

On the mounting surface M3 of the package base 42 are a pair of external electrodes 425a, 425c. These external electrodes are connected to respective base edge-surface electrodes 423a, 423c. Also, two grounding electrodes 425b, 425d are provided, which are connected to respective base edge-surface electrodes 423b, 423d.

As shown in FIG. 22B, a pair of external electrodes 425a, 425c and a pair of grounding electrodes 425b, 425d are situated apart from each other. The external electrode 425a and the grounding electrode 425d are separated from one edge of the package base 42 in the −Y'-axis direction, and the external electrode 425c and the grounding electrode 425b are separated from one edge of the package base in the +Y'-axis direction. The space SP4 between the external electrode 425a and the grounding electrode 425d and between the external electrode 425c and the grounding electrode 425b in the Y-axis direction is, for example, in the range of 300 μm to 600 μm. Also, a space SP5 is provided between the external electrode 425a, the grounding electrode 425b, and one edge of the package base 42 in the −Y-axis direction, and between the external electrode 425c, the grounding electrode 425d, and one edge of the package base 42 in the +Y-axis direction is in the exemplary range of 0 μm to 100 μm.

In the vibrating device 400, the tuning-fork type quartz-crystal vibrating piece 40 is mounted onto the second peripheral surface M2 of the package base 42 via a pair of supporting arms 406a, 406b using electrically conductive adhesive 43 (FIG. 22A). The extraction electrodes 403a, 403b of the vibrating piece 40 are electrically connected to respective connecting electrodes 424a, 424b of the package base 42. Thus, the external electrodes 425a, 425c are electrically connected to the excitation electrodes 402a, 402b, via the base edge-surface electrodes 423a, 423c, the connecting electrodes 424a, 424b, the electrically conductive adhesive 43, and the extraction electrodes 403a, 403b. Whenever an alternating voltage (voltage that alternates between positive and negative) is applied across the external electrodes 425a, 425c, the vibrating arms 405 of the vibrating device 40 vibrate at a predetermined frequency. The package lid 41 and the package base 42 are bonded using the low-melting-point glass LG.

Although the fourth embodiment is described above in the context of a vibrating device 400 comprising a tuning-fork type quartz-crystal vibrating piece 40, the tuning-fork type quartz-crystal vibrating piece can be applied with equal facility to the quartz-crystal vibrating devices of the third embodiment, which also has an outer frame connected to supporting arms and surrounding the vibrating piece.

<Method for Manufacturing the Fourth Embodiment of a Quartz-Crystal Vibrating Device>

Figure 23:
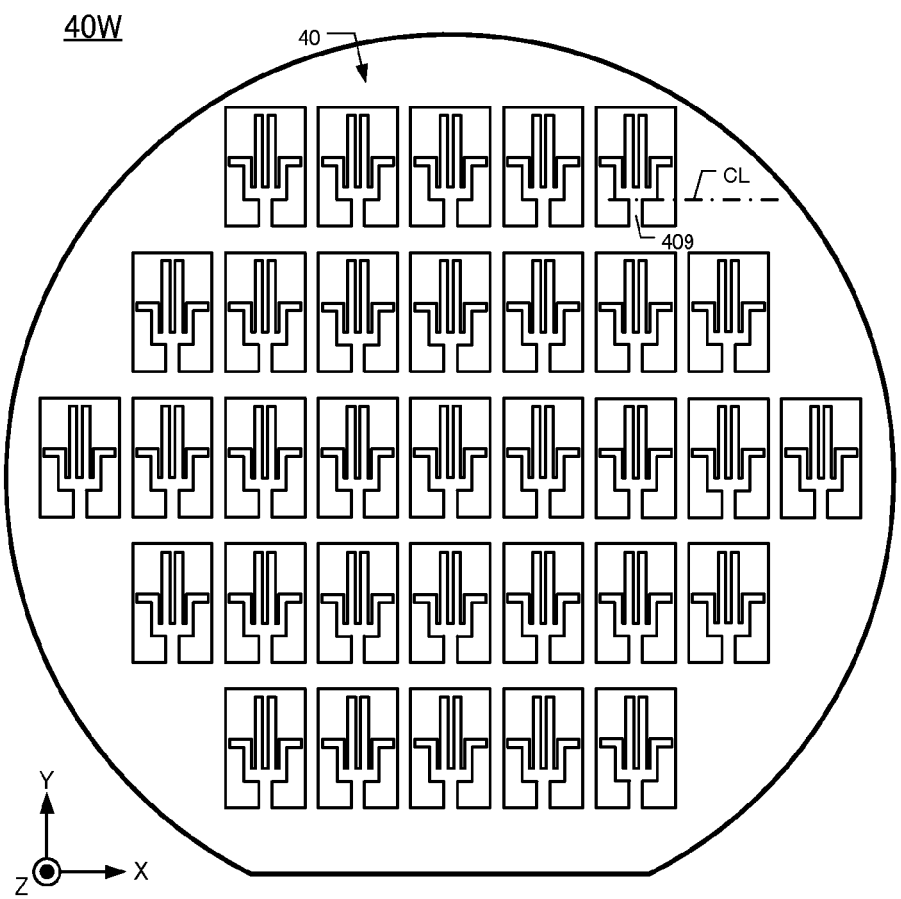
FIG. 23 is a plan view of a quartz-crystal wafer used for manufacturing the fourth embodiment.

This method for manufacturing the fourth embodiment of a quartz-crystal vibrating device 400 essentially follows the flow-chart in FIG. 3. FIG. 23 is a plan view of a quartz-crystal wafer 40W from which a plurality of tuning-fork type quartz-crystal vibrating pieces 40 can be made. FIG. 24 is a plan view of a base wafer 42W from which a plurality of package bases 42 can be made. FIG. 25 is a plan view of the lower main surface of the base wafer 42W.

In step S101 (see FIG. 23) the profile outlines of multiple tuning-fork type quartz-crystal vibrating pieces 40 are formed on a planar quartz-crystal wafer 40W by etching. Thus, for each vibrating piece, a base 404, a pair of vibrating arms 405, a pair of supporting arms 406a, 406b, grooves 407, and weights 408 are formed simultaneously. Each vibrating piece 40 is connected to the wafer 40W by a respective joining portion 409. In step S102 (see FIG. 17), the excitation electrodes 402a, 402b and the extraction electrodes 403a, 403b are formed by sputtering and etching. In step S103, the tuning-fork type quartz-crystal vibrating pieces 40 are separated into individual pieces by cutting along the cutting lines CL denoted by dot-dash lines.

In steps S121 and S122 of the protocol S12, multiple package bases 32 are manufactured. As shown in FIGS. 24 and 25, the base through-holes BH2 and the shapes and positions of the connecting electrodes 424a, 424b are different from in the first embodiment.

In step S13, the vibrating pieces 40 manufactured in protocol S10 are mounted onto respective second peripheral surfaces M2 of the package bases 42 using electrically conductive adhesive 43. Here, the vibrating piece 40 is mounted onto the second peripheral surface M2 of the package base 42, so as to align the extraction electrodes 403a, 403b with the connecting electrodes 424a, 424b on the second peripheral surface M2 of the package base 42.

In step S14, probes PB1, PB2 for measuring vibration frequency of each vibrating piece 40 are contacted to the external electrodes 425a, 425c on the package base 42B. Thus, the vibration frequency of each vibrating piece 40 is measured. Even if the alternating voltage is applied across the external electrodes 425a, 425c on the package base 42B in FIG. 25, the voltage connects to the grounding electrodes 425b, 425d of the package base 42A or 42C and does not electrically connect to the external electrodes 425a, 425c of the package base 42A or 42C. Thus, the package base 42 is not affected by the vibrating piece 40 on the package base 42.

In step S15, the thickness of the vibrating arms is adjusted by irradiating a laser beam onto the weights 408 of the vibrating arms 405. Laser ablation of material from the weights increases the vibration frequency of the vibrating arms. In step S16, the low-melting-point glass LG is heated as the lid wafer and the base wafer are compressed against each other. Thus the lid wafer and the base wafer are bonded together using the low-melting-point glass LG. In step S17, the bonded-together lid wafer and quartz-crystal wafer 40W is cut into individual pieces. Thus, several hundreds to several thousands of quartz-crystal vibrating devices 400 are mounted onto the base wafer 12W.

INDUSTRIAL APPLICABILITY

Representative embodiments have been described in detail above. As evident to those skilled in the art, the present invention may be changed or modified in various ways within the technical scope of the invention.

For example, although low-melting-point glass was used for bonding together the base wafer, quartz-crystal wafer, and lid wafer, this bonding material can be replaced with polyimide resin. Whenever polyimide resin is applied, it can be used for screen-printing or exposed after applying photosensitive polyimide resin on the entire surface.

In this specification, although the various embodiments have been described in the context of quartz-crystal vibrating pieces, it will be understood that the embodiments can be applied with equal facility to piezoelectric materials such as lithium tantalite and lithium niobate. Furthermore, the present disclosure can be applied to piezoelectric oscillators that also include an IC configured as an oscillating circuit mounted inside the package on the package base.

EXPLANATION OF REFERENCES 10, 20, 30, 30' . . . Quartz-Crystal Vibrating Piece
40 . . . Tuning-Folk Type Quartz-Crystal Vibrating Piece 10W, 30W, 40W . . . Quartz-Crystal Wafer
11, 31, 41 . . . Package Lid
11W . . . Lid Wafer
12, 12A, 12B, 22, 32, 32', 42 . . . Package Base
12W, 22W, 42W . . . Base Wafer
13 . . . Electrically Conductive Adhesive
100, 200, 300, 300', 400 . . . Quartz-Crystal Vibrating Piece
101 . . . Quartz-Crystal Piece
301 . . . Quartz-Crystal Vibrating Portion
102a, 102b, 302a, 302b, 402a, 402b . . . Excitation Electrode
103a, 103b, 203a, 203b, 303a, 303b, 303a', 303b, 403a, 403b . . . Extraction Electrode
111, 121, 311, 411, 421 . . . Base Recess
122a-122d, 306a-306d, 322a-322d, 422a-422d . . . Castellations
123a-123d, 223a-223d, 307a-307d, 323a-323d, 423a-423d . . . Edge-surface Electrodes
124a, 124b, 224a, 224b . . . Connecting Electrode
125a-125d, 225a-225d, 325a-325d, 425a-425d . . . Grounding Electrodes
304a, 304b, 304a', 304b' . . . Supporting Portion
305a, 305b, 305a', 305b' . . . Voids
307M, 323M . . . Connecting Pad
308 . . . Outer Frame
404 . . . Base Portion
405 . . . Vibrating Arms
406a, 406b . . . Supporting Arms
407 . . . Groove
408 . . . Weight
BH1, BH2, CH . . . Base Through-Holes
CT . . . Cavity
LG . . . Low-Melting Point Glass
SP1-SP7 . . . Space

What is claimed is:

1. A piezoelectric device, comprising:
a piezoelectric vibrating piece having first and second opposing principal surfaces, a respective excitation electrode on each principal surface, and a respective extraction electrode connected to each excitation electrode;
a package base having first and second opposing main surfaces, first and second opposing edge surfaces, and a rectangular profile when viewed from above the first main surface, the package base including a pair of connecting electrodes on the first main surface facing the piezoelectric vibrating piece and being connected to respective extraction electrodes, the package base also including two pairs of mounting terminals on the second main surface;
a respective pair of castellations on each of the first and second edge surfaces of the package base, the castellations being recessed toward a center of the package base; and
a respective pair of edge-surface electrodes on each of the first and second edge surfaces of the castellations, the edge-surface electrodes providing respective electrical connections between the first and second main surfaces of the package base;
wherein, of the two pairs of edge-surface electrodes, two edge-surface electrodes connect respective connecting electrodes to two respective mounting terminals.

2. The piezoelectric device of claim 1, wherein:
the two pairs of mounting terminals include two respective external electrodes that electrically connect the piezoelectric device to outside circuitry and two grounding electrodes for electrically grounding the device; and
the external electrodes and the grounding electrodes are situated diagonally across from each other on the second main surface.

3. The piezoelectric device of claim 1, wherein:
the two pairs of mounting terminals include two respective external electrodes that electrically connect the piezoelectric device to outside circuitry and two grounding electrodes for electrically grounding the device; and
the external electrodes are situated on the second main surface along the first edge surface, and the grounding electrodes are situated on the second main surface along the second edge surface.

4. The piezoelectric device of claim 1, wherein:
the package base comprises a recess defined in the first main surface; and
the piezoelectric vibrating piece is mounted on the package base using an electrically conductive adhesive, in a manner that electrically connects the extraction electrodes to respective connecting electrodes.

5. The piezoelectric device of claim 4, further comprising a rectangular package lid bonded to the first main surface of the package base, wherein the package lid and the package base are bonded together using a sealing material.

6. The piezoelectric device of claim 1, wherein:
the piezoelectric vibrating piece comprises a vibrating portion situated between the excitation electrodes and a rectangular outer frame surrounding the vibrating portion, the outer frame having first and second opposing main surfaces; and
the piezoelectric vibrating piece is disposed so as to align the extraction electrodes with respective connecting electrodes.

7. The piezoelectric device of claim 6, further comprising a package lid having first and second opposing main surfaces, wherein the second main surface of the package lid is bonded to the first main surface of the outer frame using the sealing material, and the first main surface of the package base is bonded to the second main surface of the outer frame using the sealing material.

8. The piezoelectric device of claim 1, wherein:
at least one castellation includes a protrusion situated at substantially mid-length of the respective castellation between the first and second main surfaces of the package base; and
the protrusion tapers outward from the respective castellation as viewed in an elevational section of the castellation.

* * * * *